US012396437B1

(12) United States Patent
Shafer et al.

(10) Patent No.: US 12,396,437 B1
(45) Date of Patent: Aug. 26, 2025

(54) SYSTEMS AND METHODS FOR RADIO TAG DETECTION

(71) Applicant: Arizona Board of Regents acting for and on behalf of Northern Arizona University, Flagstaff, AZ (US)

(72) Inventors: Michael W. Shafer, Flagstaff, AZ (US); Paul G. Flikkema, Flagstaff, AZ (US)

(73) Assignee: Arizona Board of Regents acting for and on behalf of Northern Arizona University, Flaggstaff, AZ (US)

( * ) Notice: Subject to any disclaimer, the term of this patent is extended or adjusted under 35 U.S.C. 154(b) by 447 days.

(21) Appl. No.: 18/052,901

(22) Filed: Nov. 4, 2022

Related U.S. Application Data

(63) Continuation-in-part of application No. 17/448,511, filed on Sep. 22, 2021, now Pat. No. 11,588,226.

(60) Provisional application No. 63/081,789, filed on Sep. 22, 2020.

(51) Int. Cl.
*A01K 11/00* (2006.01)
*G01R 23/16* (2006.01)
*G01S 3/04* (2006.01)

(52) U.S. Cl.
CPC ............ *A01K 11/006* (2013.01); *G01R 23/16* (2013.01); *G01S 3/043* (2013.01); *G01S 3/046* (2013.01)

(58) Field of Classification Search
CPC ....... A01K 11/006; G01R 23/16; G01S 3/043; G01S 3/046
See application file for complete search history.

(56) References Cited

U.S. PATENT DOCUMENTS

| | | | |
|---|---|---|---|
| 9,979,463 B1 | 5/2018 | Shafer et al. | |
| 10,277,305 B1 | 4/2019 | Shafer et al. | |
| 2006/0064725 A1* | 3/2006 | Rabinowitz | G01S 19/46 |
| | | | 342/357.31 |
| 2013/0025374 A1* | 1/2013 | Voskoboinik | G01D 5/35364 |
| | | | 73/655 |
| 2013/0070677 A1 | 3/2013 | Chang | |
| 2019/0154840 A1 | 5/2019 | Ferguson et al. | |
| 2020/0005656 A1 | 1/2020 | Saunamaeki | |
| 2020/0074982 A1* | 3/2020 | McCallum | G06N 3/08 |
| 2020/0159209 A1 | 5/2020 | Montoya-Meja | |

(Continued)

FOREIGN PATENT DOCUMENTS

GB    2593533 A    9/2021

OTHER PUBLICATIONS

Shafer, M.W. et al., Beyond Your Ears: VHF Tag Detection via Coherent Pulse Integration, The Wildlife Society Virtual Conference, Sep. 28-Oct. 2, 2020, 29 pages.

(Continued)

*Primary Examiner* — Eugene Yun
(74) *Attorney, Agent, or Firm* — IPTechLaw

(57) ABSTRACT

Implementations of a method of detecting a plurality of radio pulses may include, using at least one signal processor: pre-processing a wideband intermediate frequency signal to form a channelized segment from a software defined radio; performing coherent single-pulse correlation using a spectrogram of the channelized segment; and performing multi-pulse combining with the spectrogram, and determining whether a pulse train including a plurality of radio pulses from a desired pulsed radio signal may be present in the spectrogram.

20 Claims, 30 Drawing Sheets

(56) References Cited

U.S. PATENT DOCUMENTS

2021/0382128 A1  12/2021  Lan
2022/0069449 A1   3/2022  Xue et al.

OTHER PUBLICATIONS

Hafer, M.W. et al., UAV Wildlife Radiotelemetry: System and Methods of Localization, Methods in Ecology and Evolution, vol. 10, Jun. 29, 2019, pp. 10783-1795.

* cited by examiner

SYSTEMS AND METHODS FOR RADIO TAG DETECTION

CROSS REFERENCE TO RELATED APPLICATIONS

This document claims the benefit of the filing date of U.S. Provisional Patent Application 63/081,789, entitled "System and Method for VHF Tag Detection Via Coherent Pulse Integration" to Shafer et al. which was filed on Sep. 22, 2020, the disclosure of which is hereby incorporated entirely herein by reference.

This application is also a continuation-in-part application of the earlier filed U.S. Utility Patent Application to Shafer et al. entitled "Systems and Methods for Radio Tag Detection," application Ser. No. 17/448,511, filed Sep. 22, 2021, the disclosure of which is hereby incorporated entirely herein by reference.

GOVERNMENT LICENSE RIGHTS

This invention was made with government support under National Science Foundation Awards 1556417 and 2104570. The government may have certain rights in the invention.

BACKGROUND

1. Technical Field

Aspects of this document relate generally to systems for radio frequency detection. More specific implementations involve radio frequency detection for wildlife monitoring and research.

2. Background

Wildlife tracking has been done using tags or transmitters fastened to the wildlife to allow for monitoring and detection of the location of the wildlife. During monitoring and detection, a person enters an area on foot carrying a directional antenna connected to a radio that outputs an audible signal that corresponds to radio pulses emitted by a wildlife tracking tag received by the antenna. The person then listens to the varying volume of the audible pulses while moving the directional antenna to judge which antenna direction indicates the loudest pulses in order to identify a bearing to the animal to which the wildlife tracking tag is attached.

SUMMARY

Implementations of a method of detecting a plurality of radio pulses may include, using at least one signal processor: pre-processing a wideband intermediate frequency signal to form a channelized segment from a software defined radio; performing coherent single-pulse correlation using a spectrogram of the channelized segment; and performing multi-pulse combining with the spectrogram, and determining whether a pulse train including a plurality of radio pulses from a desired pulsed radio signal may be present in the spectrogram.

Implementations of a method of detecting a plurality of radio pulses may include one, all, or any of the following:

Pre-processing the wideband intermediate frequency signal further may include channelizing the intermediate frequency signal using a polyphase fast Fourier transform filter bank to form a set of channelized signals.

The method may include decimating to a desired sampling rate to form the channelized segment.

Performing coherent single-pulse correlation further may include forming the spectrograph by performing a short-time Fourier transform of a windowed block of the channelized segment.

Columns of the spectrogram may be squared-magnitude discrete Fourier transforms of the windowed block.

Performing multi-pulse combining with the spectrogram further may include constructing a temporal combining matrix where each column corresponds with a member of a set of outcomes of a quantized uniform random variable; generating a real-valued block-circulant matrix; and performing a matrix product of the spectrogram, the temporal combining matrix, and the real-valued block-circulant matrix to form a matrix of candidate multi-pulse temporal-spectral patterns.

Determining whether the pulse train may include the plurality of radio pulses from the desired pulsed radio signal further may include using a generalized likelihood ratio test with a maxima of elements of the matrix of candidate multi-pulse temporal spectral patterns and a threshold value to determine whether the pulse train may include the plurality of radio pulses.

The threshold value may be a scalar value determined by a desired false alarm probability function.

The desired pulsed radio signal may be generated by a wildlife tracking tag.

Determining whether the pulse train may include the plurality of radio pulses from the desired pulsed radio signal further may include using a sparse matrix representation of each of the temporal combining matrix and of the real-valued block-circulant matrix.

The method may include, after determining the pulse train including the plurality of radio pulses may be present in the spectrogram, pre-multiplying the spectrogram using a frequency-blinder matrix and using a time-blinder matrix and post-multiplying the spectrogram using the frequency-blinder matrix and using the time-blinder matrix.

Implementations of a method of detecting a plurality of radio pulses from a desired radio emitting device may include, using at least one signal processor, pre-processing a pulsed radio signal to form a channelized segment; performing single-pulse correlation using a spectrogram of the channelized segment; performing multi-pulse combining with the spectrogram; and determining whether a pulse train from a desired radio emitting device may be present in the spectrogram.

Implementations of a method of detecting a plurality of radio pulses may include one, all, or any of the following:

Pre-processing the pulsed radio signal further may include channelizing the pulsed radio signal using a polyphase fast Fourier transform filter bank to form a set of channelized signals.

The method may include decimating to a desired sampling rate to form the channelized segment.

Performing single-pulse correlation further may include forming the spectrograph by performing a short-time Fourier transform of a windowed block of the channelized segment.

Columns of the spectrogram may be squared-magnitude discrete Fourier transforms of the windowed block.

Performing multi-pulse combining with the spectrogram further may include constructing a temporal combining matrix where each column corresponds with a member of a set of outcomes of a quantized uniform random variable; generating a real-valued block-circulant matrix; and performing a matrix product of the spectrogram, the temporal combining matrix, and the real-valued block-circulant matrix to form a matrix of candidate multi-pulse temporal-spectral patterns.

Determining whether the pulse train from the desired radio emitting device may be present in the spectrogram further may include using a generalized likelihood ratio test with the maxima of elements of the matrix of candidate multi-pulse temporal spectral patterns and a threshold value to determine whether the pulse train may include the plurality of radio pulses.

The threshold value may be a scalar value determined by a desired false alarm probability function.

After determining whether the pulse train from the desired radio emitting device may be present in the spectrogram, the method may include pre-multiplying the spectrogram using a frequency-blinder matrix and using a time-blinder matrix and post-multiplying the spectrogram using the frequency-blinder matrix and using the time-blinder matrix.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended radio tag detection systems and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such radio tag detection systems and related method, and implementing components and methods, consistent with the intended operation and methods.

A discussion of various implementations of radio tag types and wildlife tracking techniques including the use of very high frequency (VHF) tags can be found in U.S. Pat. No. 9,979,463 to Shafer et al., entitled "UAV wildlife monitoring system and related methods," Ser. No. 15/489,602, filed Apr. 17, 2017 and issued May 22, 2018, the disclosure of which is hereby incorporated entirely herein by reference.

Figure 1:
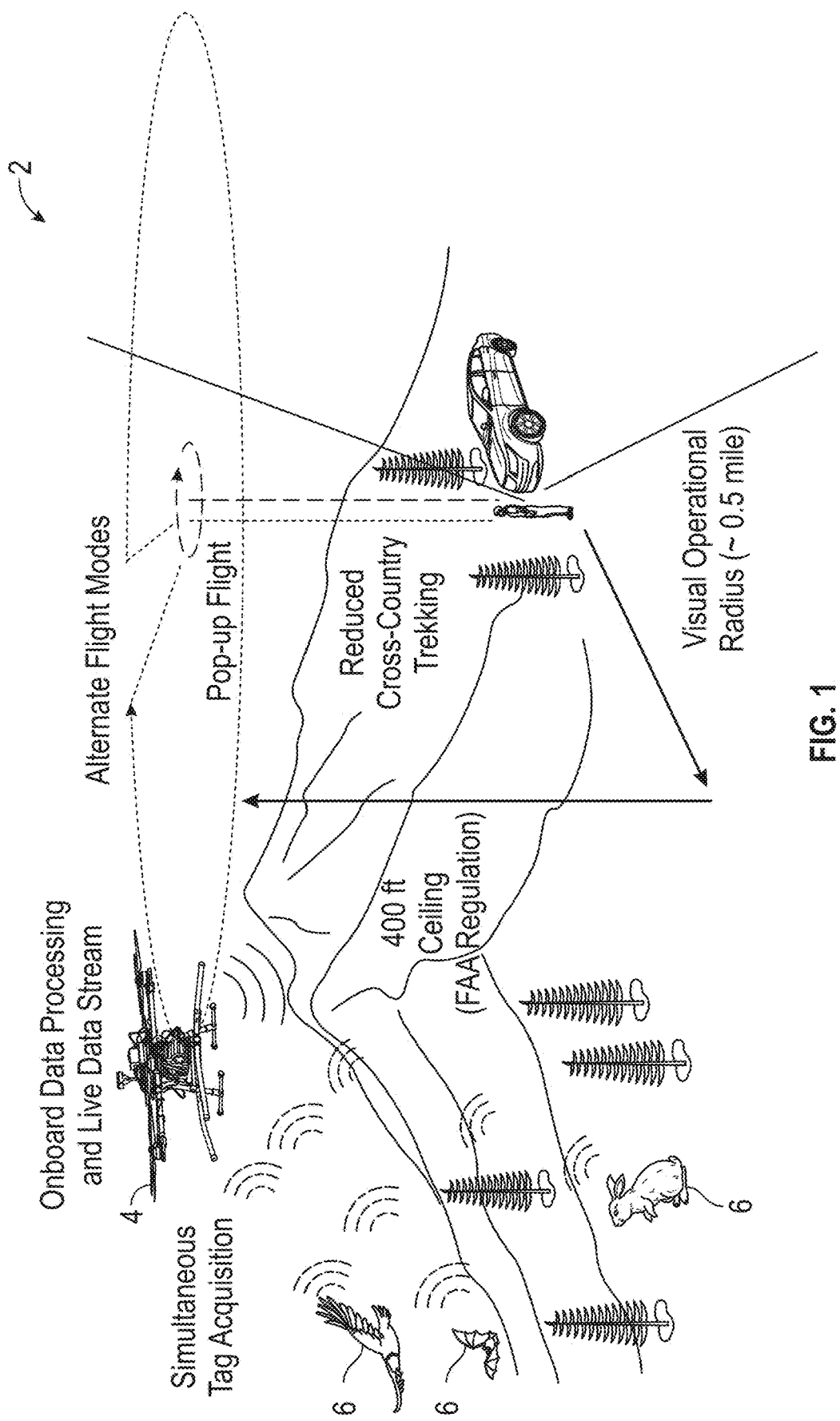
FIG. 1 is a diagram of a wildlife tracking operational environment.

Referring to FIG. 1, a diagram of an implementation of a wildlife tracking operational environment 2 is illustrated. As illustrated the user may utilize an unmanned aerial vehicle 4 with an onboard software defined radio to attempt to locate one or more tags associated with one or more animals 6 that may be able to fly or may be located on the ground. The use of the UAV may allow the user to substantially reduce the amount of travel on the ground by the human operator as the UAV eliminates the need to use audio signal tracking and a directional antenna to attempt to locate tags from each animal. In various implementations disclosed herein, the use of a UAV based radio tag locating system may allow for both accurate detection of individual tags and multiple tags associated with different animals essentially at the same time.

Figure 2:
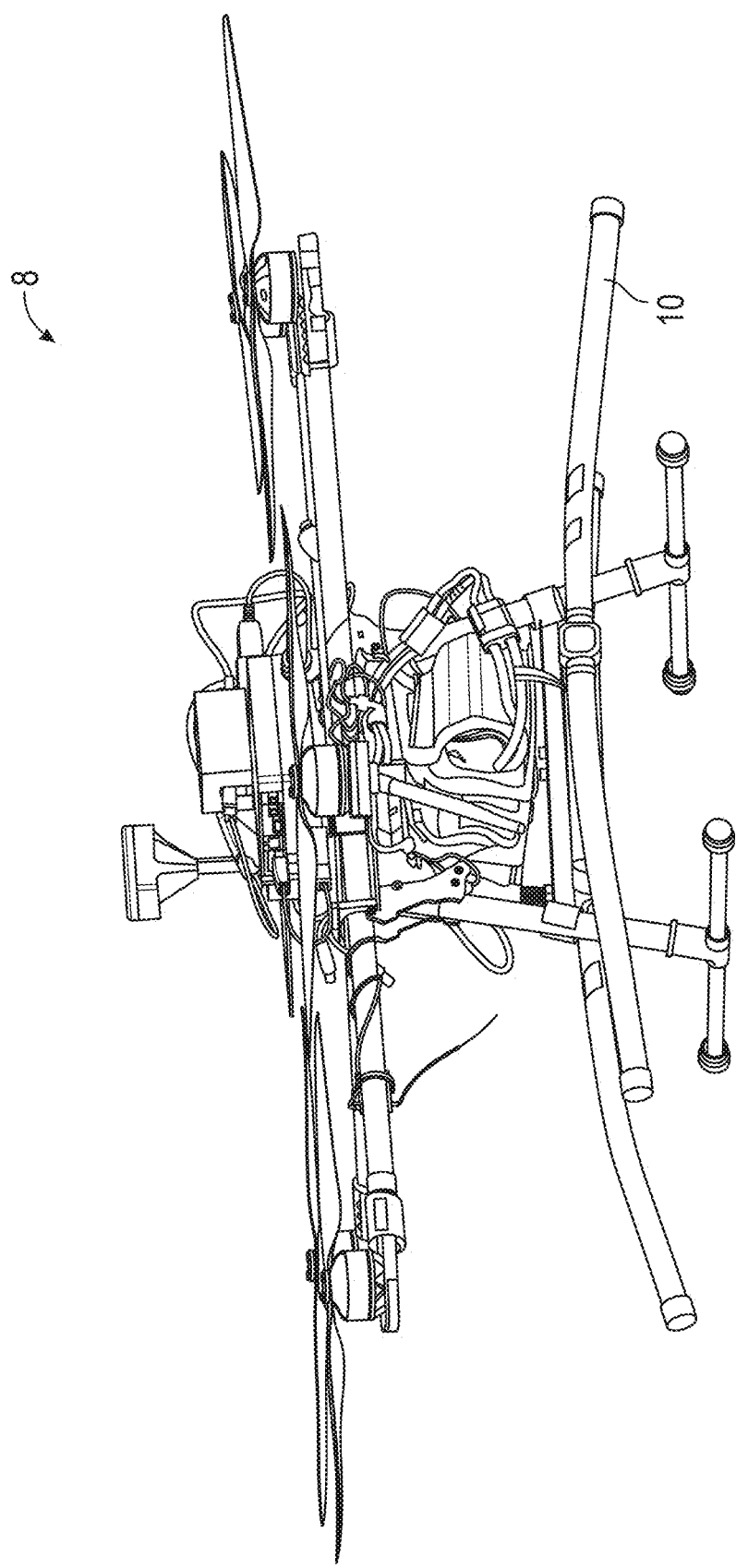
FIG. 2 is a perspective view of an implementation of an unmanned aerial vehicle (UAV)

Referring FIG. 2, the implementation of a UAV 8 that may be utilized in various system and method implementations disclosed herein is illustrated. The UAV-RT system illustrated consists of a UAV, payload. and Ground Control Station (GCS). The hex-rotor vehicle uses a Pixhawk flight controller for autonomous execution of flight plans. The radiotelemetry payload includes a VHF antenna, software defined radio (SDR), and single-board computer that communicates with the GCS via a WiFi telecommunication channel.

Figure 20:
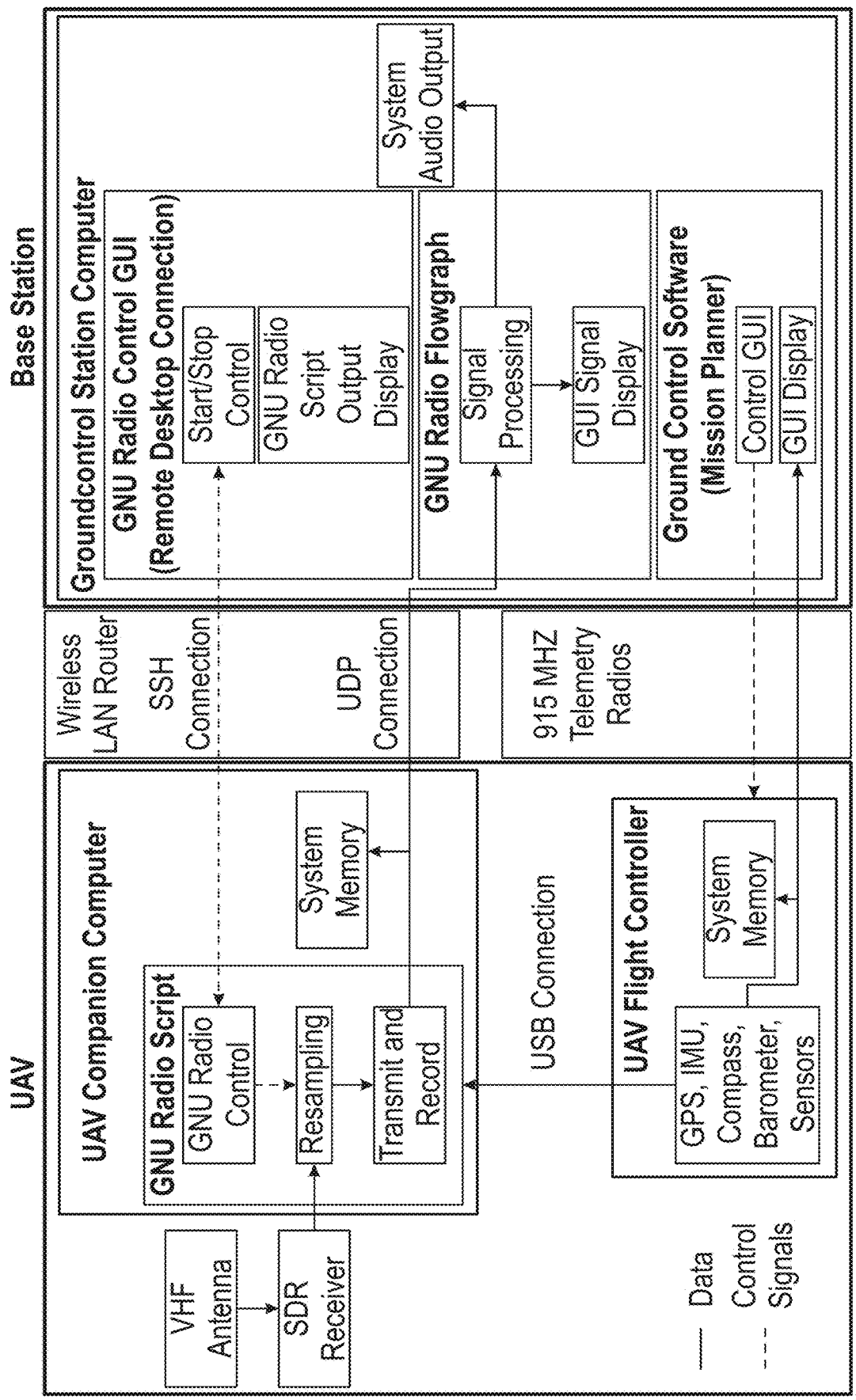
FIG. 20 is a block diagram of an implementation of a UAV flight control system and of an implementation of a base station.

Communication between the Pixhawk and companion computer enables synchronized radio and vehicle data records. The GCS (which is implemented on a laptop computer) allows for flight planning and monitoring, and can be configured to monitor VHF data during flight. During system operation, bearing estimation uses received signal strength (RSS) and antenna attitude when tag pulses from a radio tag are detected. The UAV flight controller provides the attitude log, along with the global positioning system (GPS)-measured location for localization. The radio record provided by the SDR is fused with vehicle telemetry as shown in the avionics and software block diagram illustrated in FIG. 20. As illustrated in FIG. 20, vehicle telemetry is accessed by a GNU Radio flowgraph using a custom Python script and recorded on the companion computer/base station signal processor as a time-stamped log file. The GNU Radio program "flowgraphs" are developed through a block diagram GUI programming language (GNU Radio Companion) or Python in various implementations.

Referring to FIG. 2, the UAV implementation uses a carbon hexacopter frame. A 3D printed payload enclosure includes mounts for the system's GPS and VHF antenna. The implementation illustrated in FIG. 2 weights 4.73-kg system mass and a 20-Ah battery, providing 20 to 25 minutes of flight time. Referring to FIG. 20, the Pixhawk Mini flight controller runs Arducopter firmware which allows for predefined flight plans in autonomous operation mode. The flight controller communicates with GCS via a 915-MHz vehicle telemetry radio telecommunication channel for in-flight waypoint updates and monitoring of the vehicle via the GCS. The open source Mission Planner may be utilized as the GCS software to operate the base station. Flight plans including waypoints can be programmed prior to launch using a combination of the Takeoff, Loiter Turns and Return to Launch commands, where the altitude, number of spins and latitude/longitude coordinates are programmed to move the vehicle between waypoints and spin in place to collect direction of arrival (DOA) data. Connectivity between the vehicle's companion computer and the GCS computer for the purpose of science payload control is maintained through either a router established wireless network or by configuring the companion computer/base station to establish its own wireless network.

Figure 21:
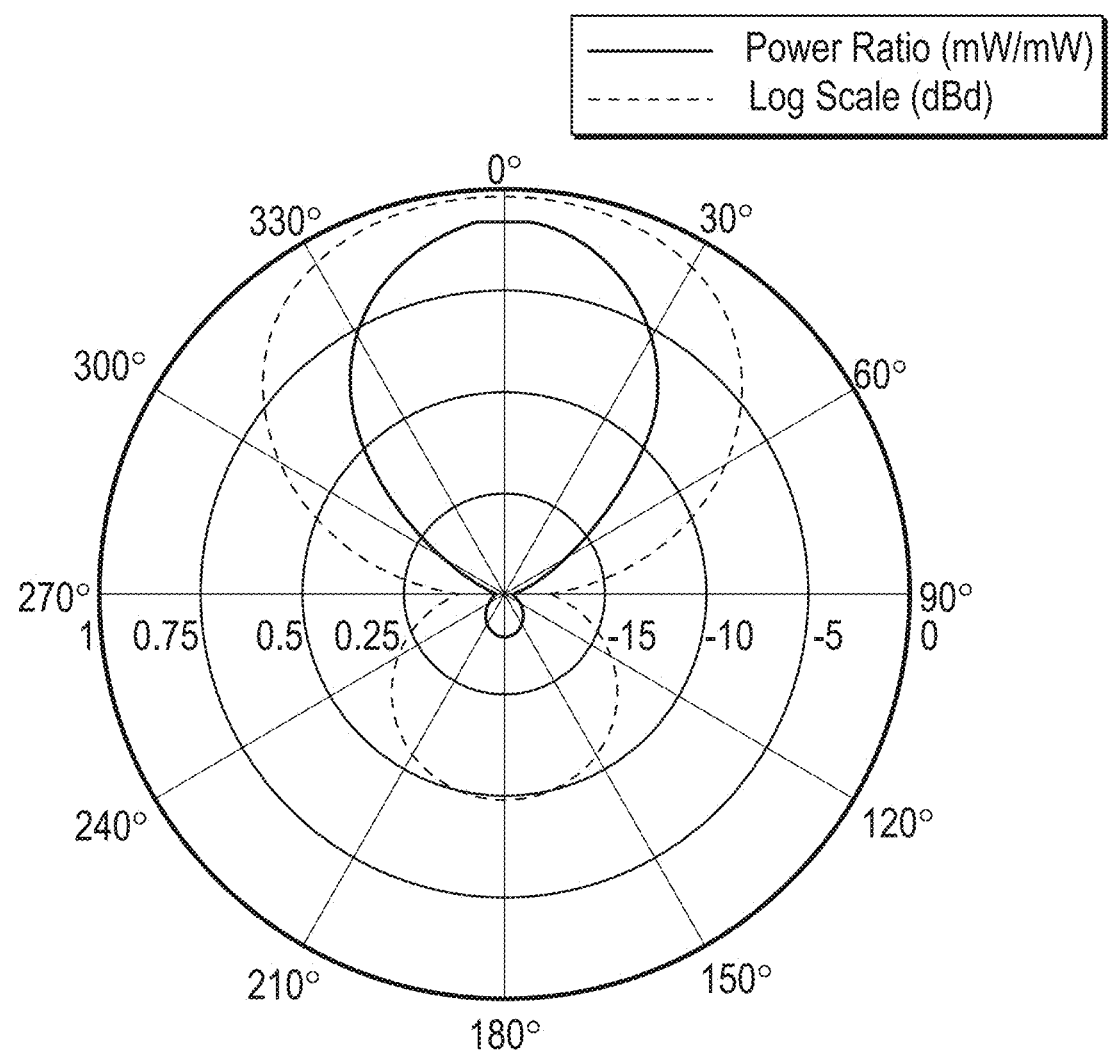
FIG. 21 is a diagram of the power ratio of a directional antenna implementation.

Referring to FIGS. 2 and 20, The UAV-RT payload consists of an H-antenna 10, an SDR front-end, a single-board computer and a WiFi modem. Directional and omni-directional antennas can be interchanged in various implementations. In particular implementations, an antenna marketed under the tradename TELONICS RA-23K by Telonics, Inc. of Mesa, AZ for directional search methods. The gain pattern of the RA-23K is illustrated in FIG. 21. In the implementation illustrated in FIG. 2, the Airspy R2 SDR (24-1,700 MHz bandwidth) utilized can provide both 2.5 and 10 million samples/second data rates. In various implementations, the lower data rate is sufficient at the low uncertainty typically present (about 1 KHz) of an exact tag carrier frequency (around 100 MHz).

Figure 22:
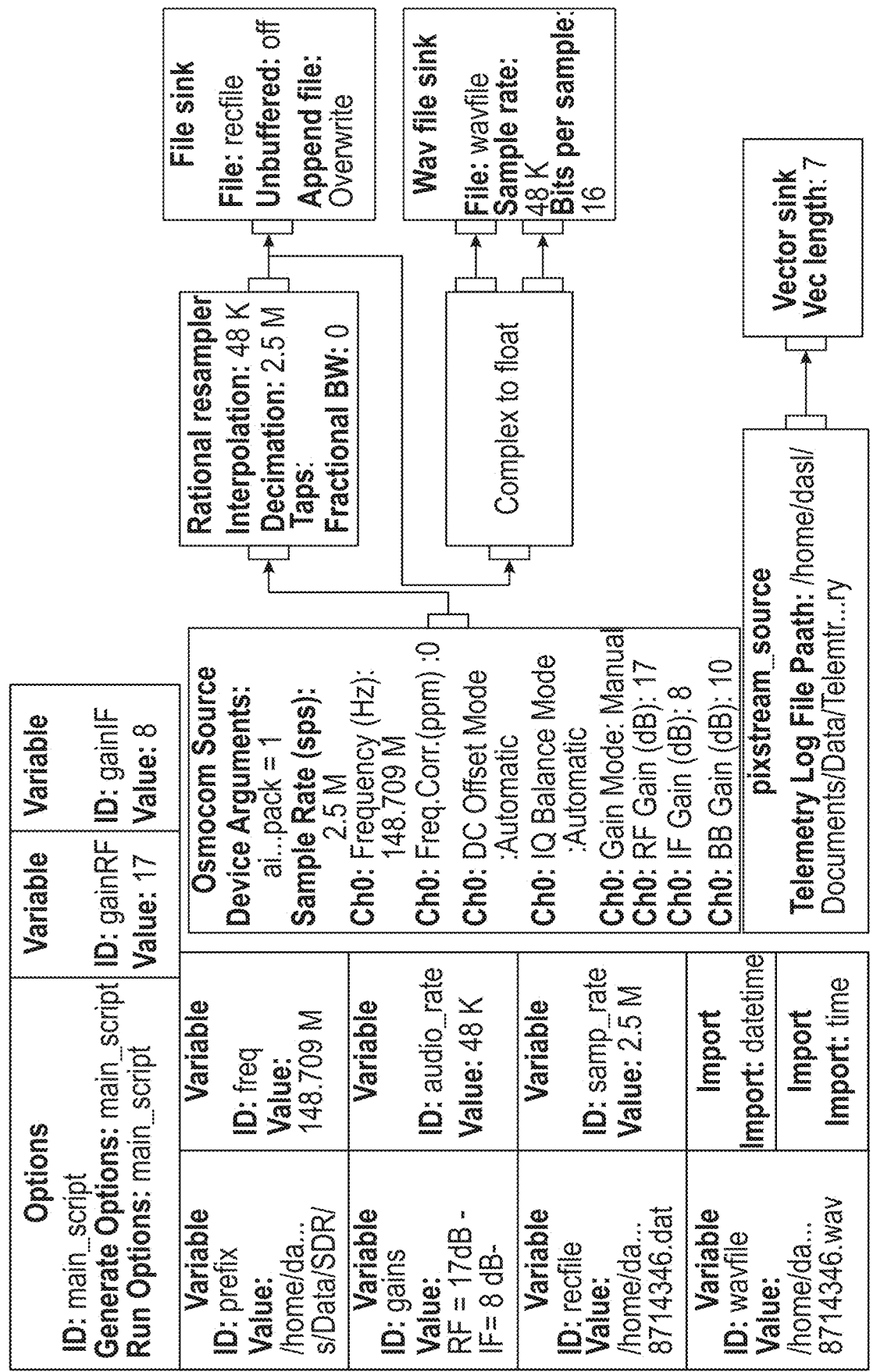
FIG. 22 is a flow diagram of a flowgraph used in a method implementation for processing radio data.

Referring to FIG. 22, a block diagram of a flowgraph implementation used for processing radio data received by the SDR is illustrated. GNU Radio software is utilized to control and process datafrom the SDR. GNU Radio supports network-based transmission of received radio data via a user datagram protocol connection. In various implementations, this feature enables users at the GCS to both hear and see radio spectra in real time, but is limited by the range of the WiFi connection. The flowgraph implementation illustrated in FIG. 22 deployed on the vehicle's companion computer/base station processor receives, processes, records, and if configured, transmits the received data over WiFi to the GCS. In various implementations, interruptions in the wireless network connection do not affect the integrity of the on-board data record. A custom Python script was written that communicates with the flight controller over a serial link. The script is written as a GNU Radio block and thus is included as part of the flowgraph running on the companion computer/base station processor.

Figure 23A:
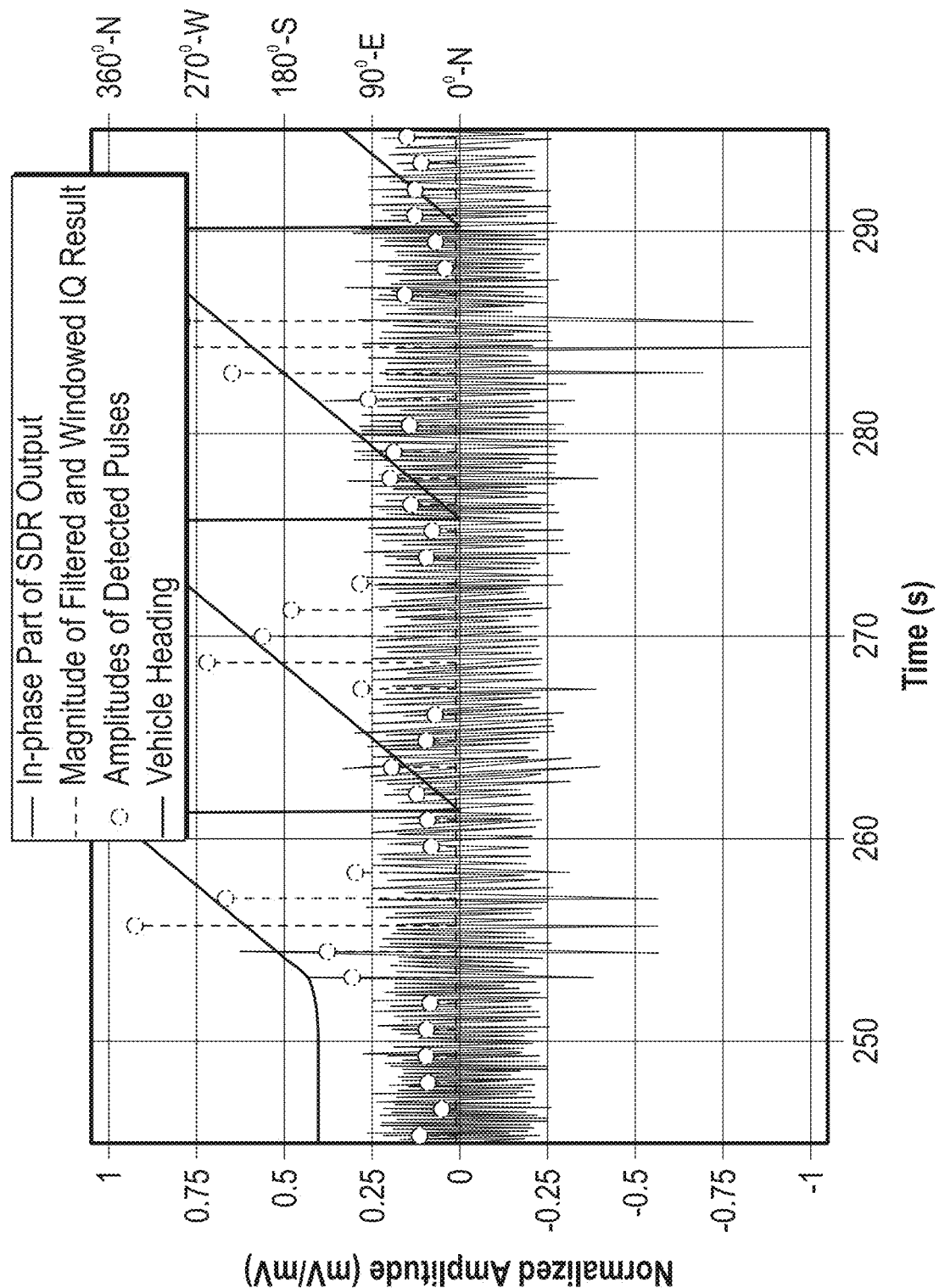
FIG. 23A is a time series plot of filtered radio data with showing data maximums.

In various implementations, radio signals are received by the SDR front end and downconverted to baseband. The magnitude of this resampled in-phase/quadrature (IQ) data (time series data in FIG. 23A) is then filtered in particular implementations using a third-order, 160-Hz bandwidth Chebyshev type II bandpass filter, centered at the baseband pulse frequency (20 dB stopband attenuation) of the radio tag being tracked. This frequency can be measured prior to tag deployment (a priori) or by observing the spectrum of the received data in various implementations. A Chebyshev type II filter has a flat passband so that a slight drift in the transmitter or receiver oscillator frequency does not alter the magnitude of the filtered pulses. In other implementations, however, a filter other than a Chebeyshev filter may be employed.

This incoming data from the SDR front end is a complex-valued I/Q data stream. The radio data is then separated into segments of approximately 4 s. Methods for determining the exact time length of these segments (time windows) is discussed further on in this document. To remove noise and reduce the processing load, the radio data is then bandpass filtered around the approximate center frequency of the pulse train and filter/decimate to a sampling rate of Ts. The filter bandwidth is determined by the pulse bandwidth and the a priori uncertainty of the center frequency of the pulse train. A Cheveyshev filter may be employed at this stage. Since the SDR data is discrete-time, a single pulse of duration L samples indexed in time by nTs→n can be represented by $$p[n; \delta, \theta] = a_L[n - \delta]e^{j\varphi[n-\delta]}, \quad (1)$$

where $$a_L[n] = \begin{cases} a[n], & n \in \{1, 2, \ldots, L\} \\ 0, & \text{otherwise,} \end{cases} \quad (2)$$

and where $\delta$ is a delay and $\theta=\{a[n], \varphi[n]; n \in \{1, 2, \ldots, L\}\}$ captures the intra-pulse features—the magnitude sequence $a[\cdot]$ and phase trajectory $\varphi[\cdot]$.

Because fast frequency-domain algorithms are utilized, the incoming data is processed in segments of samples whose durations ns are specified to contain at least K pulses; a segment may contain K full pulses, K full pulses and a portion of an additional pulse, or K+1 full pulses. We model the pulse repetition intervals (PRIs) as follows: for tag i's pulses indexed as k=1, ..., K+1, the starting sample of pulse k follows the starting sample of pulse k−1 by $\gamma_i^k$ samples, the inter-pulse sample time, with $Y_1^i=0$. Using equations (1), (2), $\delta^i$ is defined as the delay from the start of the segment to the first pulse of tag i, and define Oxi as the intra-pulse features of pulse k of tag i, so that pulse k of tag i is:

$$p[n; \delta^i + \Sigma_{j=1}^k \gamma_j^i, \Theta_k^i] \quad (3)$$

Let $[\cdot]_{n_f}^{n_f+n_s-1}$ be the operator that selects elements $n_f, \ldots, n_f+n_s-1$ from a larger vector of length $n_s$ from the incoming I/Q stream. Then the pulse set in the cleaved vector for tag i in the segment can be expressed as the vector $$s(\delta^i, \gamma^i, \Theta^i) = [\Sigma_{k=1}^{K-1} p[n; \delta^i + \Sigma_{j=1}^k \gamma_j^i, \Sigma_k^i]]_{n_f}^{N_f+n_s-1} \quad (4)$$

The parameters of the pulse train are a priori uncertain. For example, the inter-pulse interval results from a timing circuit. In implementations of aa minimal-complexity tag transmitter, a capacitor is charged and discharged through a resistor by a transistor. Because of variations in component manufacturing, circuit assembly and resulting parasitic effects, temperature, and noise, the inter-pulse interval varies about short- and long-term means. These effects motivate modeling using random variables. Therefore $\gamma^i=\{\gamma_k^i\}_1^{K+1}$ is a vector of up to K+1 random variables that characterize the PRIs; similarly, the random vector $\Sigma^i=\{\theta_k^i\}_1^{K+1}$ captures the intra-pulse features.

From classical detection theory, the outcomes of equation (4) include the set of hypotheses in an M-ary detection problem in the case of a single tag; when appropriately discretized into a finite set, the outcomes also form correlation templates matched to all possible received pulse train signals.

The noisy received signal for all tags is the vector $$r=\Sigma_i s(\delta^i, \gamma^i, \Theta^i)+n \quad (5)$$

where n is zero-mean circularly-symmetric complex noise with covariance matrix $\Sigma=[nn^H]$ where ($n^H$ is the conjugate transpose of n and $E[.]$ is the expectation).

With the filtered and processed radio data, the signal processor of the base station then proceeds with further signal processing to detect pulse trains (and the time location of the various pulses within them). Key to detection of tag pulse trains is two-stage coherent processing of the pulses: phase-coherent matched filtering or correlation of the individual pulses and coherent combining of multiple pulses, where these are performed jointly to gain the SNR advantage of multi-pulse combining. Let the kth pulse be represented as the $D_k$-element column vector $p_k$; its optimum correlation template $w_k=\Sigma^{-1} p_k$, where $\Sigma^{-1}$ is the $D_k \times D_k$ noise whitening filter. If the pulse locations are known (corresponding to a single member of the set of outcomes of equation 4), then the coherent multi-pulse correlation can be represented as an $n_s$-element correlation or equivalently as the sum of a set of single-pulse correlations, with the templates $\{w_k\}_1^{K+1}$ temporally aligned with their pulses. The correlation output is then $$\Sigma_k \alpha_k w_k^H p_k \quad (6)$$

where $\alpha_k$ performs a phase rotation for each pulse, aligning them to a common phase for coherent combining.

Unfortunately, the inter- and intra-pulse features are not known a priori, and each feature has a different type and degree of uncertainty. In various system and method implementations, the overall goal is to surmount this uncertainty to capture the maximum possible signal energy in a segment. To accomplish this, a parametric search of the time-frequency plane is performed for a set of pulses that yields the maximum signal contribution to the coherent multi-pulse correlation. This search is aided by features of the pulse train, namely that the pulses are quasi-sinusoidal and their center frequencies are highly correlated.

Because in various method implementations the search is done in both time and frequency, a short-term Fourier transform (STFT) which a set of temporarily overcalled fast Fourier transforms (FFTs) with a window size (FFT length) filter. Analysis in frequency is performed by the orthogonal decomposition of the FFT. In this portion of this document, a summary of the theory of coherent multi-pulse detection using the STFT is discussed. Further in this document a computationally-efficient implementation is discussed in detail, with special emphasis on how the uncertainty in the inter-pulse intervals greatly complicates multi-pulse combining, with a solution using expanding analysis blocks, a block-shifting (shift-sum) combining strategy, and overlapped segments.

Equation 4 captures all possible locations of the pulses in a time interval (segment) and this set is denotes as T. The pulses from a tag have an essentially common spectral content, and we denote the set of possible spectra as F. The time-frequency search space is $\Omega=T \times F$, and we seek the element $\omega \in \Omega$ that best captures the pulse set. To simplify the discussion in this section, the assumption is made that the pulse's temporal location in the data segment is known. The DFT's composing the STFT employ a set of unitary (complex orthogonal) templates that span the frequency uncertainty of the pulse. Thus even if the pulse has a non-linear phase trajectory, and is therefore not constant in frequency, we can decompose its energy into discrete frequency bins without loss. The FFT's that compose the STFT can be described efficiently using the matrix formulation of the DFT, where in the expression v=Fv, v is the DFT of the vector v using the Fourier matrix F. Because F is unitary, $F^{-1}=F^H$ and $v=F^H v$.

With the above notation, the discrete Fourier transform of the pulse is p=Fp, and a correlation template w can be synthesized from its frequency-domain representation, the complex spectral weighting vector w, using $w=F^W w$. With this result, the correlation operation is $$w^H p = w^H F F^{-1} p = w^H F p \qquad (7)$$

Equation 7 illustrates that the correlation can be performed by taking the inner product of w and the DFT $p=Fp$ of p.

For example, consideration the situation where the received signal vector p of radio data matches the frequency and phase of bin $f_c$ of the DFT. For simplicity, the assumption is made that the noise is white, so $\Sigma=I$, that p is unit-norm, and the DFT matrix F is normalized so that its rows are unit-norm. Let $1_l$ be the vector with element l equal to one with all other elements zero. Then, because p is matched to bin $f_c$, $Fp=1_fc$. From equation 7, $$w_{fc}^H p = w_{fc}^H F p = w_{fc}^H 1_{fc} \qquad (8)$$

But $w_{fc}^H = (Fw_{fc})^H = (Fp)^H = 1_{fc}^H$ so $w_{fc}^H p = 1_{fc}^H 1_{fc} = 1$. Moreover, $w_f^H p = 0$ for all $f \ne f_c$, so the correlator—the FFT kernel at bin $f_c$—is uniquely matched to the pulse. In this simple case, pre-multiplying the FFT output by $w_m^H$ is unnecessary, but, in general the operation performs a weighted sum of the FFT outputs corresponding to the spectrum of the signal vector, accounting for 1) spectral leakage between FFT bins when there is not an exact frequency match, and 2) phase non-linearity.

Note that the uncertainty in frequency can be assessed using pre-deployment measurements, enabling us to use prior information encoded as a bound on the range of frequencies searched. However, the initial phase is unknown due to varying initial conditions in the tag's transmitter circuitry at the triggering of a pulse. To maximize the signal-to-noise ratio when we perform multi-pulse combining, the correlator outputs can be coherently combined, meaning that the correlator outputs are be aligned in phase in particular method implementations. In other implementations, however, incoherent combining may be employed during signal processing.

For each $\omega \in \Omega$, the individual DFT-based single-pulse correlator outputs can be combined to form the coherent multi-pulse correlator output $z_\omega$ for the frequency and pulse times indexed by w. As noted earlier, there may be K or K+1 pulses in a segment; it can be assumed here that K for simplicity. Let $y_\omega$ be the vector of coherent single-pulse correlator outputs for $\omega$, i.e., K values selected from a row of the STFT for the segment.

Then $$y_\omega = (y_\omega[1], \ldots, y_\omega[K])^T \qquad (10)$$

where where $y_\omega[k] = \gamma_\omega[k] e^{i \angle y_\omega[k]}$. The optimum multi-pulse correlation template is $v_\omega = y_\omega$ so that the output of the multi-pulse correlator in a particular implementation is $$z_\omega = v_\omega^H y_\omega = \sum_{k=1}^{K} (\gamma_\omega[k])^2 \qquad (11)$$

In other implementations, however, where inter-pulse phase variability is zero the output of the multi-pulse correlator may be represented as $$z_\omega = \|v_\omega^H y_\omega\|^2 = \left\| \sum_{k=1}^{K} y_\omega[k] \right\|^2$$

Where the magnitude squared of the vector sum of the $y_\omega$ terms is used. The combination of coherent single-pulse correlation and coherent multi-pulse correlation is designed for putative sets of pulses at specific frequencies and times.

Because there are $|\omega|$ values that are candidates to be the test statistic for the decision, a generalized likelihood ratio test (GLRT) is used to select the test statistic z according to $$z = \max_{\omega \in \Omega} z_\omega \qquad (12)$$

which is compared with a which is compared with a threshold to make the decision of whether or not a K-pulse train is present in the data. Intuitively, the GLRT can be interpreted as follows: z is the maximum of the collection of output energies from the multi-pulse correlations. Thus the time-frequency region specified by $\omega^* = \arg\max_{\omega \in \Omega} z_\omega$, having the greatest energy, is the region occupied by the signal (if present) with the greatest probability, and is hence the best choice for using in the signal/no-signal decision. In implementations where multiple tags are present for tracking, this use of the test statistic can be modified to look for frequency peaks with sufficient frequency spread (local maxima rather than total maxima). Since, as discussed later, the time-frequency search space is dependent on the a priori specified frequency spacing of the pulses from the tags at issue, the test statistics may not be compared across frequency bins. Once a set of candidate maxima has been determined, a peeling algorithm can be employed to further identify peaks and sidebands across the various frequency bins.

In various implementations, z is used to define a hypothesis test as follows: under hypothesis $H_1$, the tag is transmitting the pulse train. Under hypothesis $H_0$, the tag is not transmitting (for any number of reasons), or is so far out of range that the signal power is effectively zero. Equation 12 is used to model z as the outcome of the random variable Z. In discovery of the timing of the pulses in the pulse train, it is not yet known if the pulse train is present, and if so, what its energy is. Thus only considering a threshold that depends on the false alarm probability selected by the user makes sense at this point. In various implementations, the decision threshold scalar 1 is selected such that $$P_f = \int_\lambda^\infty f_{Z|H_0}(z|H_0) dz \qquad (13)$$

The only contribution to Z under $H_o$ is noise; because in this case the per-sample noise is zero-mean circularly-symmetric complex Gaussian, the variance of the noise at the output of the coherent single-pulse correlator is $\sigma^2 = w^H \Sigma w$. Note that if the noise is white and $w^H w = 1$, then this noise power is equal to the per-sample noise power $\sigma_n^2$. In general, if the noise is white, $\sigma^2 = \sigma_n^2 w^H w = \sigma_n^2 \|w\|^2$.

Under $H_o$, $y_\omega[k]$ (see equation (10)) is zero-mean circularly-symmetric complex Gaussian; from the inner product structure of single-pulse correlation, it is a weighted sum of zero-mean circularly-symmetric complex Gaussian random variables. Any particular $Z_\omega$ is correlated with many others which share with it overlapping data in time and frequency, so the joint distribution of the random variables $Z_\omega$, $\omega \in \Omega$, is very complex, and the distribution of Z—being the maximum of $|\Omega|$ sums of correlated exponential r.v.'s—is analytically intractable. However, simulation can be used to compute $f_{Z|H0}(z|H_0)$, the empirical probability density function of Z under $H_0$.

The associated cumulative distribution function of Z under $H_0$ $\hat{F}_{Z|H_0}(z|H_0) = \int_{-\infty}^{z} \hat{f}_{Z|H_0}(x|H_0) dx$, is used along with $P_f$ to determine the decision threshold using the relationship $$P_f = 1 - \hat{F}_{Z|H_0}(\lambda|H_0) \qquad (14)$$

so that any root-finding method can be used to compute the (single) zero $\lambda$ of the function $$g(z) = 1 - P_F - \hat{F}_{Z|H_0}(z|H_0)$$

Since by equation 11 $y_\omega[k]^2$ is the squared magnitude of $y_\omega[k]$, under $H_0$ the output $z_\omega$ of the coherent multi-pulse correlator for any $\omega$ is Erlang distributed. Appendix A filed herewith, the disclosure of which is hereby incorporated entirely herein by reference, contains additional information regarding the use of the Erlang distribution and the test statistics.

The empirical probability distribution $\hat{f}_{Z|H_0}$ on which the threshold $\lambda$ is based depends on a number of input parameters, so full characterization of the entire parameters space could be computationally expensive. In order to reduce the number of simulation runs, experimental design methods can be deployed to non-dimensionalize dependent and independent variables in order to reduce the dimensionality of this experimental space. The test statistic z can be thought of as a dependent variable.

$$z = g(S_{xx}(\omega), F_s, t_p, t_{ip}, t_{ipu}, K, M_t) \quad (15)$$

Subsequently it will be shown that z also depends on the spectral weighting matrix (W) and the overlap fraction (OLF) of the short-time Fourier transform stage of processing. Both of these terms are nondimensional and are likely to be held constant, so they are excluded from discussion here. The noise power spectral density $S_{xx}$ could be constant across the bandwidth for a given receiver in the white noise case, but could vary across the bandwidths considered. Frequency dependent variations in $S_{xx}$ most often result from anti-alias filtering methods in the decimation stages in the radio processing, i.e. the rolloff of power at high frequency. The pulse parameters such as duration ($t_p$), inter-pulse time ($t_{ip}$), and the inter-pulse time uncertainty ($t_{ipu}$) all affect the distribution of the test statistic, as they drive the parameters of the first-stage matched filter and that of the second-stage incoherent combinations. The overlap fraction (OLF) of the STFT of the matched filter stage and the number of pulses (K) used for pulse combining affect the distributions as well. Finally, the time search method ($M_t$) is a binary selector which dictates if prior information regarding the pulse arrival time is used. Later in this document it will be demonstrated that if there is no prior prediction of a pulse arrival, a wide time block is used but with prior knowledge a much smaller window/time interval width is possible. The effect of this difference in time window size necessarily affects the resulting distribution of the test statistic.

Examining the parameters of equation 15 indicates that both power (W) and inverse time (Hz) can be taken as the base dimension. The test statistic z has units of power (W), as it is the square of the output of a DFT, a transformation that maintains the units of the its input data (V). With two dimension and seven parameters, the Buckingham $\frac{Pi}{M}$ theorem states that equation 15 can be expressed as $$\zeta \equiv \frac{Z}{S_{xx(\omega)}F_S} = G(F_s t_p, F_s t_{ip}, F_s t_{ipu}, K, M_t) \quad (16)$$

In this relationship, the noise power spectral density $S_{xx}(\omega)$ and the sample rate $F_s$ are chosen as the parameters used for non-dimensionalization. A 6-dimensional space requires empirical mapping rather than the initial 8-dimensional space. Moreover, this formulation allows for generalization of the thresholds for radios with different noise figures or sample rates that differ than that used to generate the thresholds. Note that K and $M_t$ are already non-dimensional. This formulation could also be used to tailor thresholds for non-white or time-varying noise. The new non-dimensional input parameters on the right side of equation 16 represent the number of samples in the pulse, the inter-pulse samples, and the inter-pulse uncertainty in samples. Under the null hypothesis, the non-dimensional parameter $\zeta$ of equation 16 can be thought of as the ratio of the noise power at the output of the signal processing to input noise power over the entire segment containing the combined pulses. Under $H_1$, non-dimensionalizing the test static in the same way would give a measure of the signal+noise power at the output of the processing to the input noise power. Similar to the dimensional formulation of equation 17 below, non-dimensional thresholds (A) can be determined for this non-dimensional test statistic based on $$P_f = 1 - \hat{F}_{Z|H_0}(\Lambda|H_0) \quad (17)$$

where $\hat{F}_{Z|H_0}(\zeta|H_0)$ is the cumulative probability distribution of the non-dimensional test statistic $\zeta$ and Z' is simply the non-dimensional version of the random variable Z.

Determination of these thresholds requires the calculation of the noise power spectral density, which is trivial under $H_0$. During processing though, an estimate must be made under $H_1$ without knowledge of the spectral or temporal location of the signal. Using the entire segment will necessarily include some signal energy, but for a limit number of tags and/or low pulse power scenarios, the total signal energy will be relatively small and can be included without undue influence on the resulting threshold. In high SNR scenarios when this assumption cannot be made, amplitude thresholding of the time domain signal can be used to reduce the influence of the signal energy on the noise power estimate. Alternatively, priori estimates of signal bandwidth and/or transmission times could be used to exclude portions of the data. When pre-computing thresholds based on equation 16, it is may be helpful to note that the effect of the non-dimensional inter-pulse pulse time ($F_s t_{ip}$) on the thresholds is negligibly small for small perturbations to its nominal value.

The investment of human and machine resources in tracking can be very high, so that the cost of false detections is high. In various implementations, if a positive detection is declared for a segment, the next segment is examined to confirm the detection. Here it is appropriate to use the inter-pulse interval and spectral signature from the analysis of the previous segment to narrow the search space, and test if the maximum in that space exceeds the threshold. Thus the same putative signal is tested twice independently, yielding an overall false alarm probability of $P^2_F$.

In implementations where multiple tags are involved, detection of one tag's pulse train follows the two-step process of identifying the maximum-energy coherent multi-pulse correlation result per equation 12 and making the decision by comparing it to the threshold $\lambda$. In most research studies, multiple animals are tagged. To improve human trackers' ability to identify them, tags with different center frequencies are selected, so that only one tag is often in any post-decimation frequency band. However, if the pulse trains of I≥2 tags occur in the same post-decimation bandwidth, all coherent multi-pulse correlation outputs greater than $\lambda$ represent possible positive detections. In this case, the correlation results can be ordered and the highest I tested against the threshold. Positive detections are then subject to confirmation process using test statistics as described above.

A particular implementation of a method of detecting a plurality of pulses in a radio signal from a radio tag is subsequently described herein for the exemplary purposes of this disclosure. Other implementations, however, may be constructed using the principles previously described and those that will be subsequently described in this document. The implementation described here may be carried out in a way intended to be computationally more efficient than other approaches.

The implementation's goal is to temporally filter the data to capture only all possible pulse locations (minimizing the noise contribution) in the face of uncertainty about the location of the first pulse and the PRI. The algorithm presented is designed to achieve two goals: (1) minimum computational complexity, and (2) maximum computational efficiency. It achieves (1) by only computing each summand once and it achieves (2) by vectorizing sums to the maximum extent possible and enabling multi-threaded and multi-core implementations in various hardware implementations.

Figure 3:
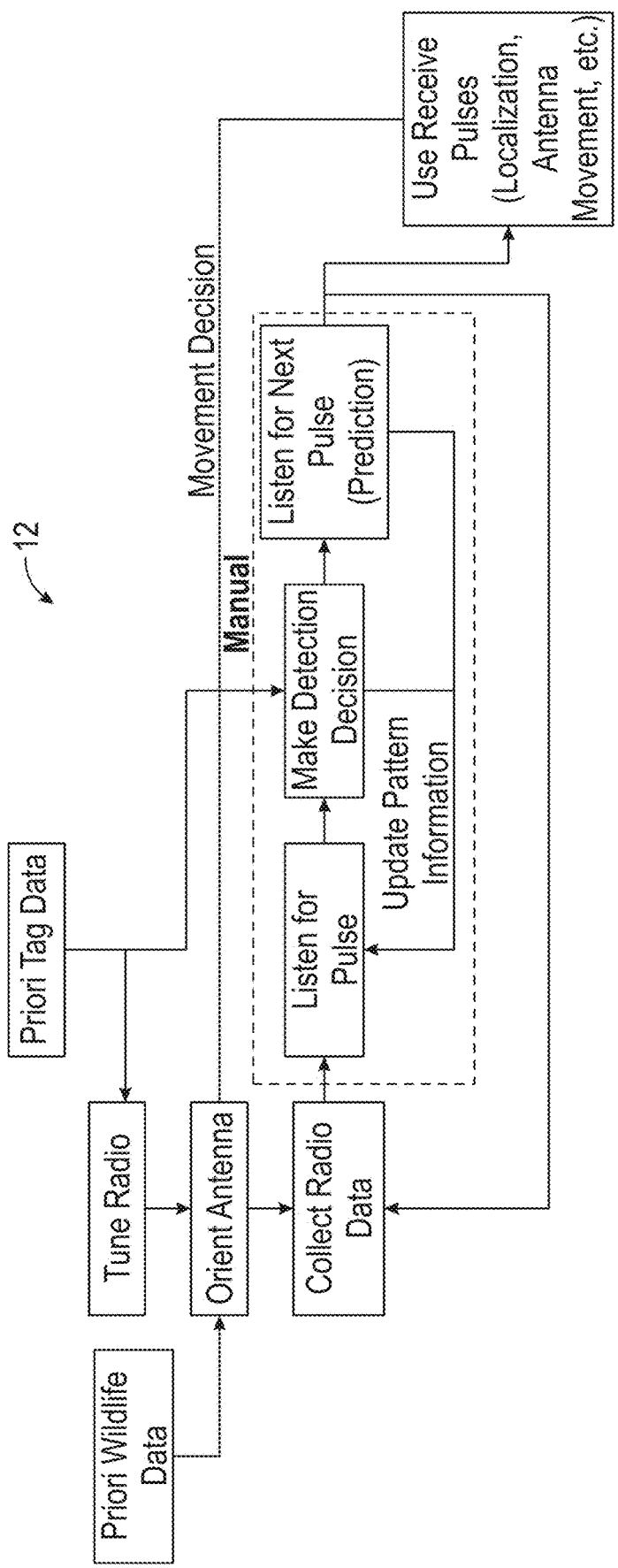
FIG. 3 is a flow diagram of an implementation of a manually operated radio tag tracking system that uses audible radio pulses.

Referring to FIG. 3, a flowchart of a method of manually localizing a radio tag is illustrated. As previously discussed, a manual method involves the use of a hand-held directional antenna connected to a radio that outputs an audible sound pulse when a radio pulse is received. Using a priori information about the center frequency of the radio tag desired to be tracked, the user tunes the radio, orients the antenna, collects radio data, and then listens for the pulse. Based on the sound, the user determines whether the proper radio tag has been located. The user then decides whether to reorient the antenna prior to listening to the next pulse. When the next pulse is received, the user then again can decide whether to reorient the antenna or whether a good bearing direction down the highest gain axis of the antenna to the radio tag has been determined based on the audio feedback. In practice, this process is repeated as the user walks toward the radio tag or walks in a pattern in an area as a bearing is first developed. This manual process is very time consuming and requires that the user be able to adequately receive the radio pulses from the radio tag basically within 6-8 feet of ground level, which makes attempting to locate animals that reside in shallow burrows, cracks in rocks, or caves, more difficult due to signal propagation issues.

Figure 4:
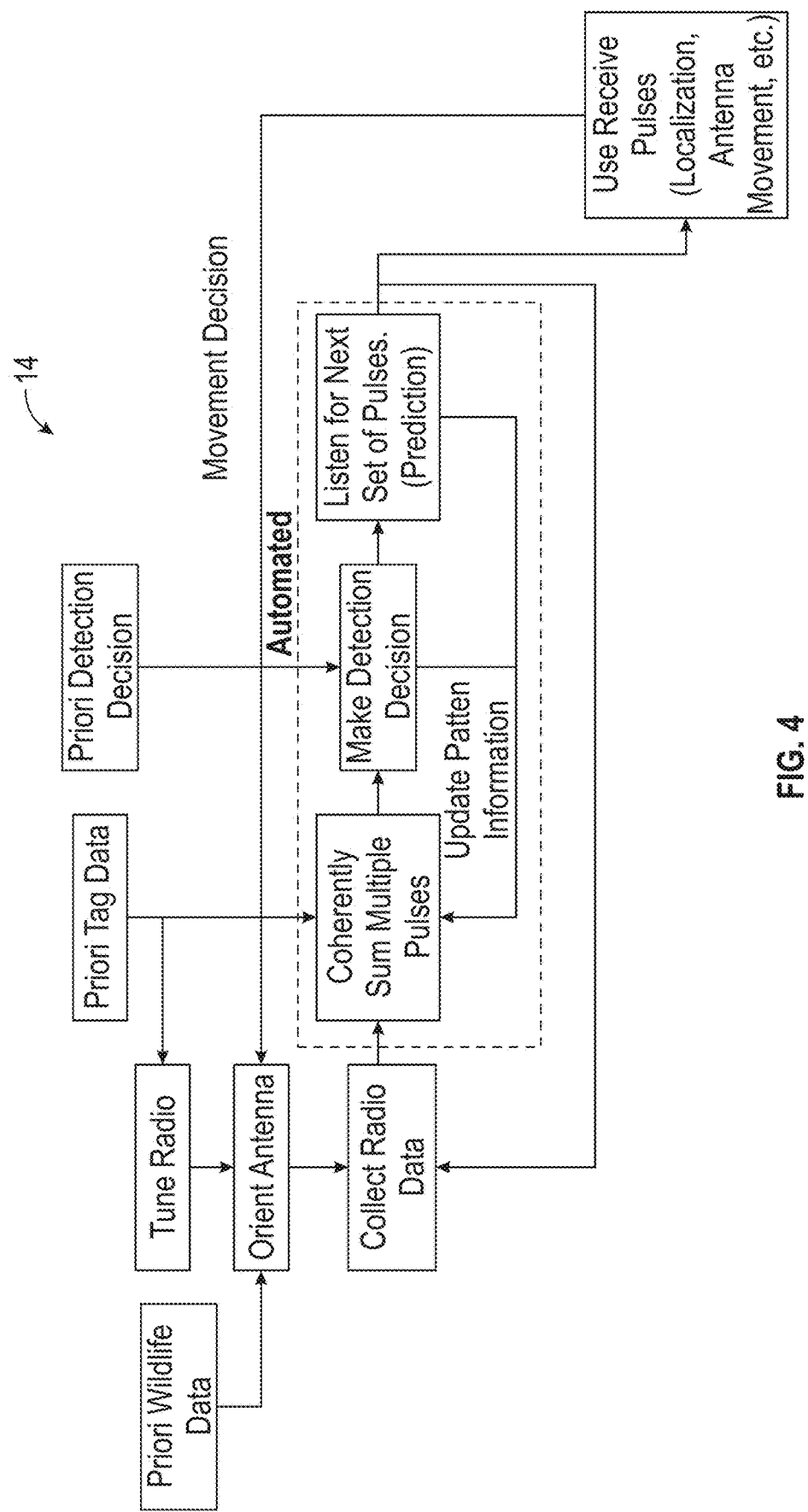
FIG. 4 is a flow diagram of an implementation of a method of using a radio tag tracking system like those disclosed herein.

At a high level, referring to FIG. 4, a flowchart of a method of detecting a plurality of radio pulses 14 is illustrated. In this method implementation, a priori information is available of the type of wildlife being tracked, frequency information about the radio tag associated with the wildlife, and the nominal pulse frequency for the radio tag. While the use of UAVs is illustrated as being used to carry the antenna and radio in to the sky far higher than what a human user can reach, the method implementation for detecting pulses could be utilized using a hand held antenna and hand carried radio in some implementations, with a corresponding decrease in accuracy because of higher SNR from such signals. In all implementations, the directional antenna is oriented while radio data is collected using a SDR radio. While the implementation of FIG. 4 indicates that the radio data is then processed using the techniques previously described and which will be described hereafter to coherently sum multiple pulses, in other implementations, incoherent combining using the principles disclosed herein may be used as well. Based on the results of the combining of the pulses, a detection decision is made as to the location of a predetermined number of pulses in the radio data. This determination is made using a signal processor associated with the base station which may be included in the base station or may be a separate computing device coupled to the base station. The detection decision is made automatically by the system, and then in various method implementations the system listens for a future predetermined number of future pulses using a prediction of when in the time sequence the future pulses will arrive. With the results of the future pulses, various method implementations will then track the radio tag signal and calculate a bearing. With the bearing to the tag, various method implementations will provide a movement decision/recommendation to the UAV or user to adjust the orientation of the antenna. Following sufficient data collection, the method may include calculating a bearing to the radio tag using any of the method implementations disclosed in this document.

Figure 5:
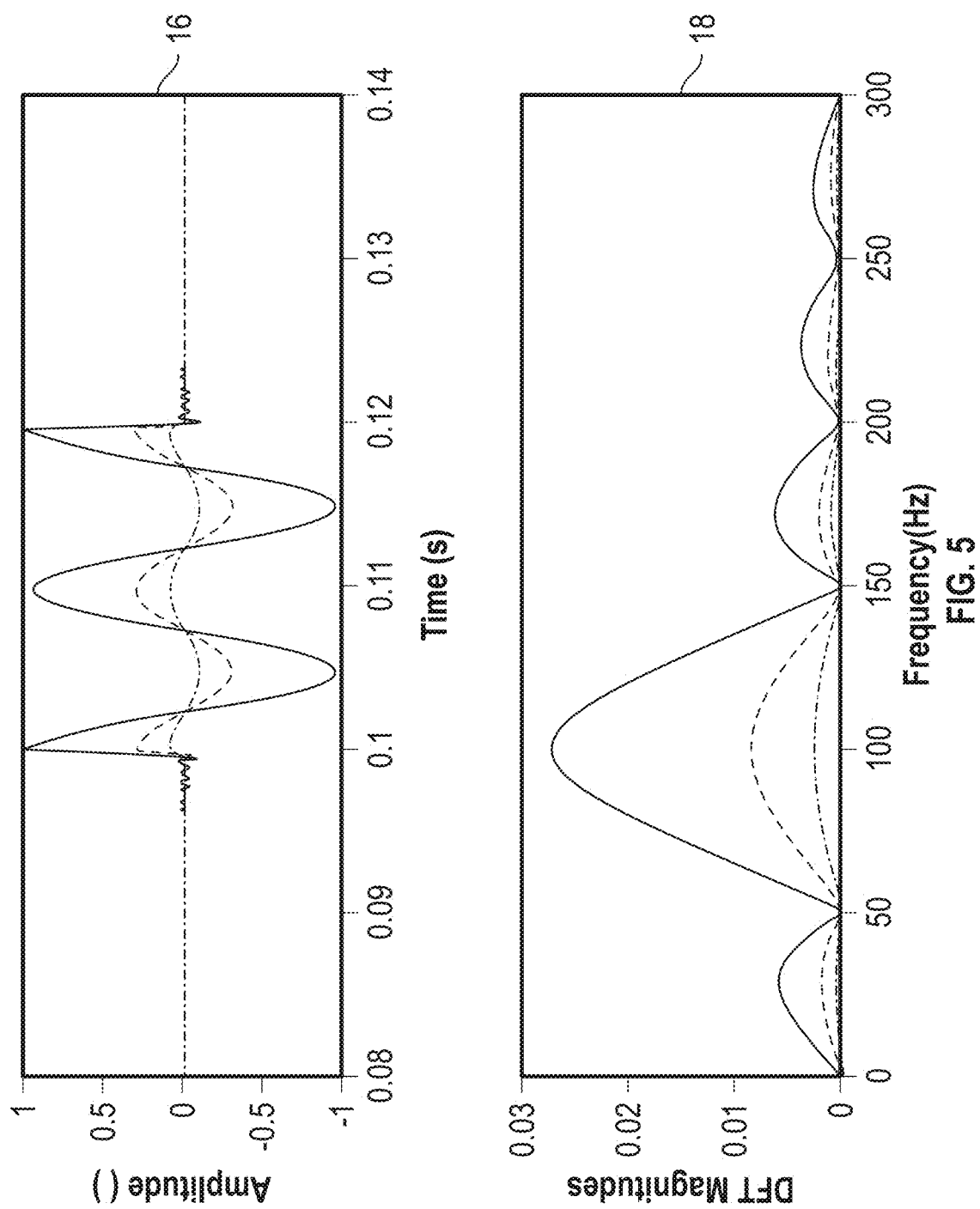
FIG. 5 is a time domain and discrete Fourier transformed frequency domain graph of a radio pulse signal.
Figure 6:
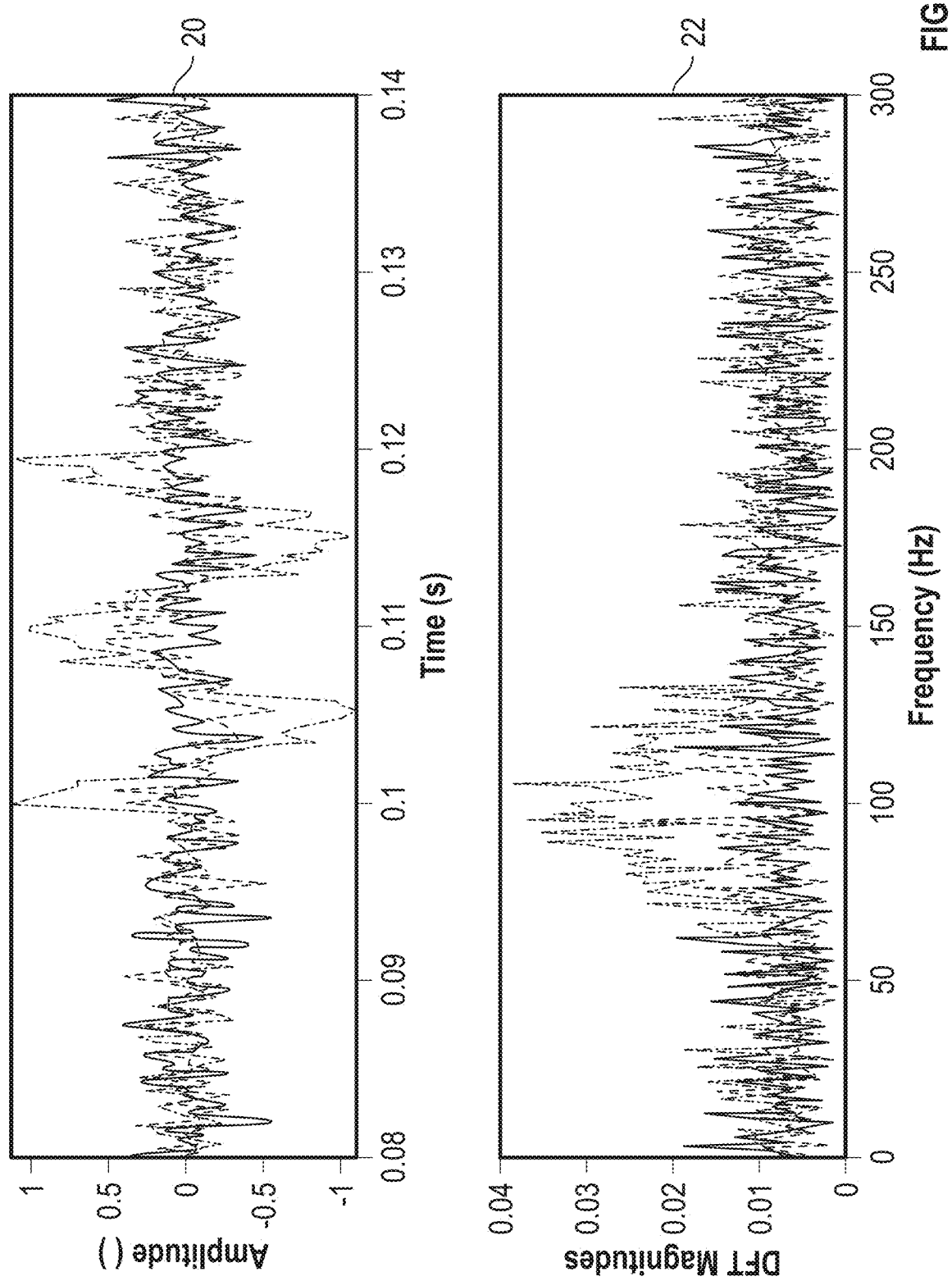
FIG. 6 is a time domain and discrete Fourier transformed frequency domain graph of a radio pulse signal with noise.

The concepts of discrete Fourier transforms and short-time Fourier transforms have been previously discussed in this document. Examples of what is happening in the time and frequency domain for each can be found in the following figures. FIG. 5 illustrates a radio pulse in the time domain in the top graph 16 where the highest frequency portion of the pulse occurs at the center of the pulse. In the bottom graph 18 the discrete Fourier transform of the radio pulse is illustrated, showing that the maximum magnitude of the DFT occurs at the highest frequency point in time of the pulse. Thus the DFT permits transformation of the pulse from the time to the frequency domain. The figures illustrated in FIG. 5 were artificial signals without noise. FIG. 6 illustrates a time domain graph 20 of the pulse of FIG. 5 with noise added and the corresponding DFT magnitude graph 22 that shows that the maximum still occurs at the highest observed frequency point of the pulse. The introduction of noise means that the use of probability statistics will be needed to confirm whether an observed maximum magnitude on the DFT graph 22 actually is a global maximum or is instead only a local maximum resulting from noise.

Figure 7:
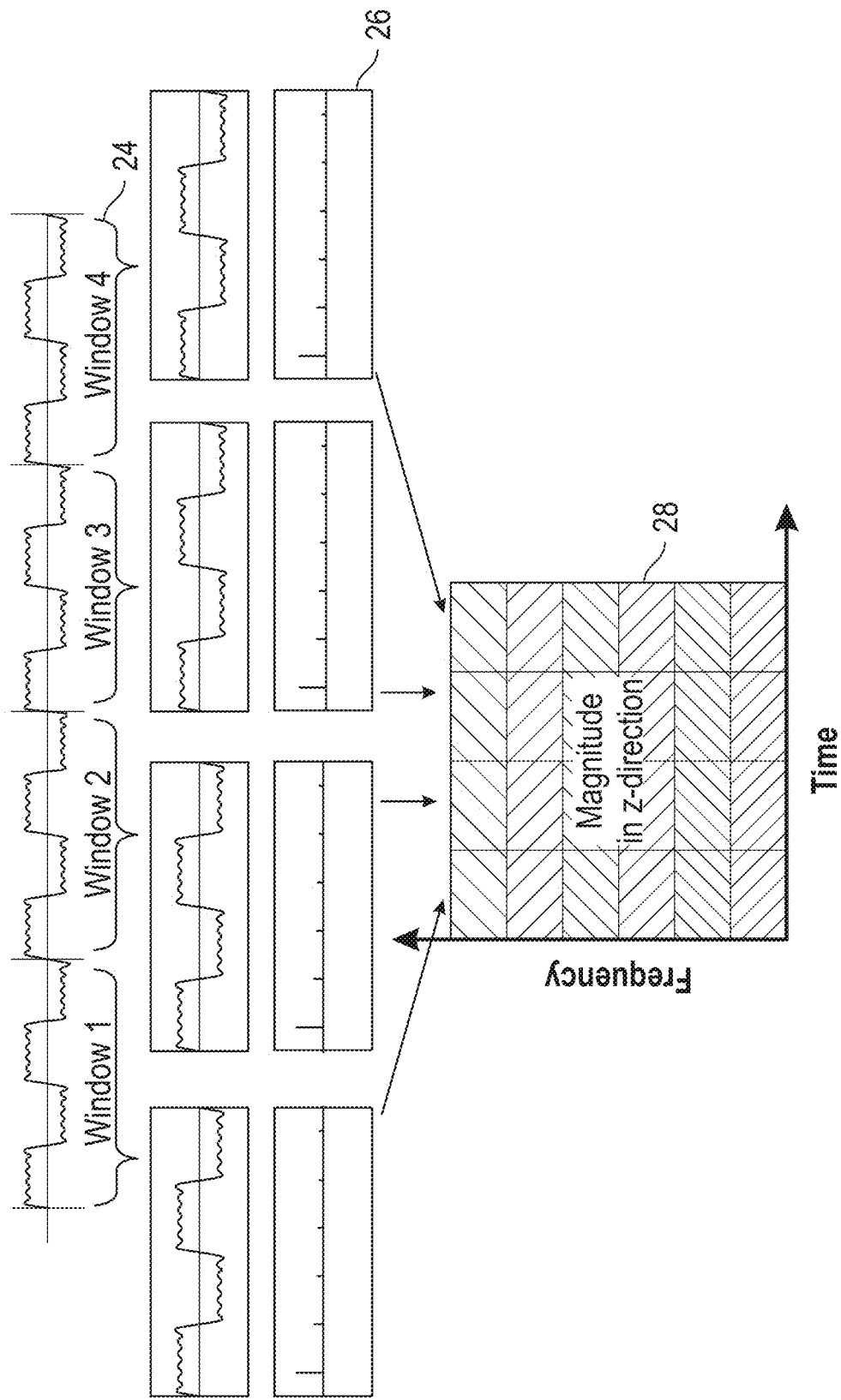
FIG. 7 is a diagram of multiple pulses where short-time Fourier transforms have been taken of four time windows and the resulting transformed summed to form a matrix.
Figure 8:
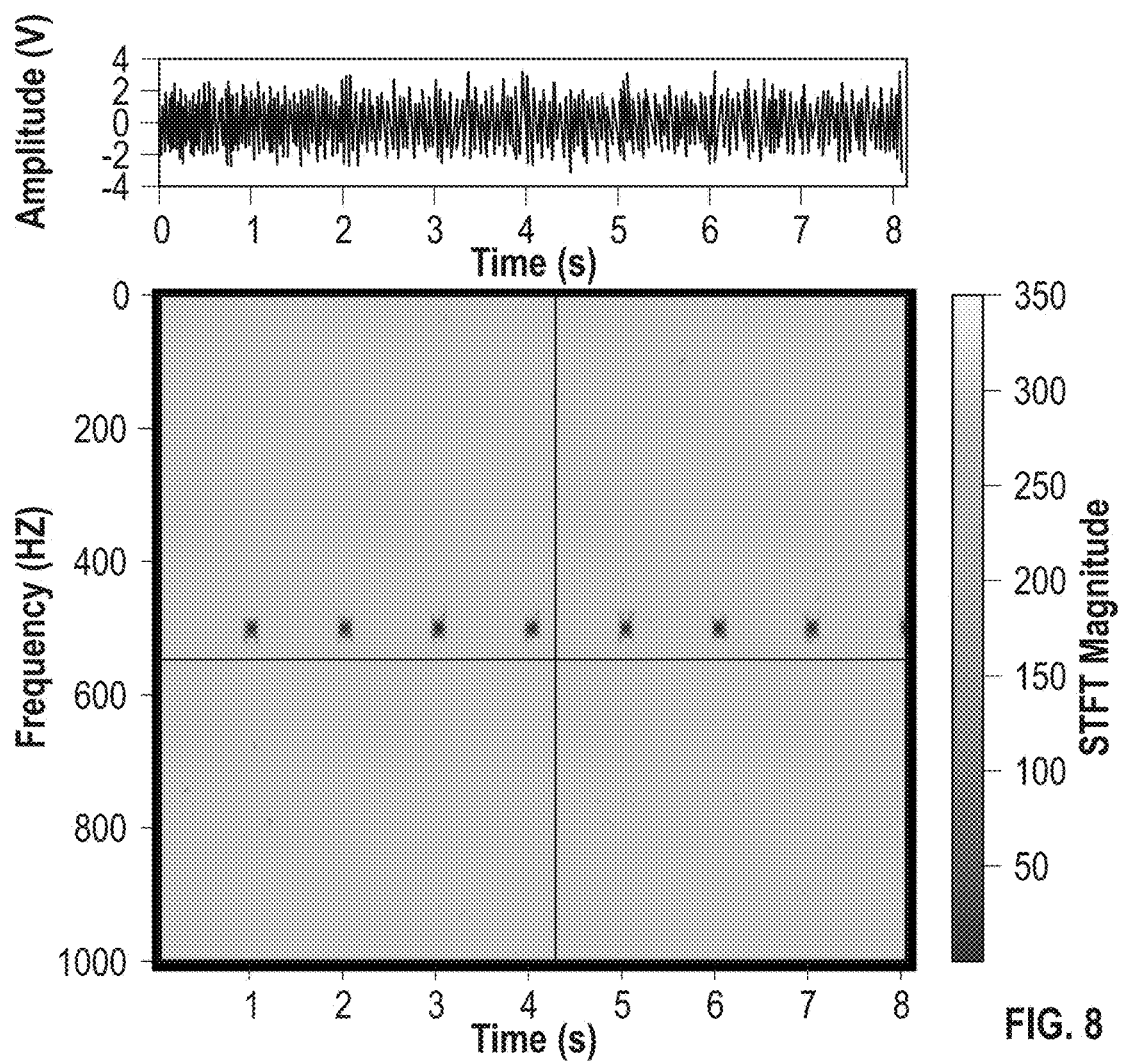
FIG. 8 is a spectrogram of a synthetic pulse signal implementation.
Figure 9:
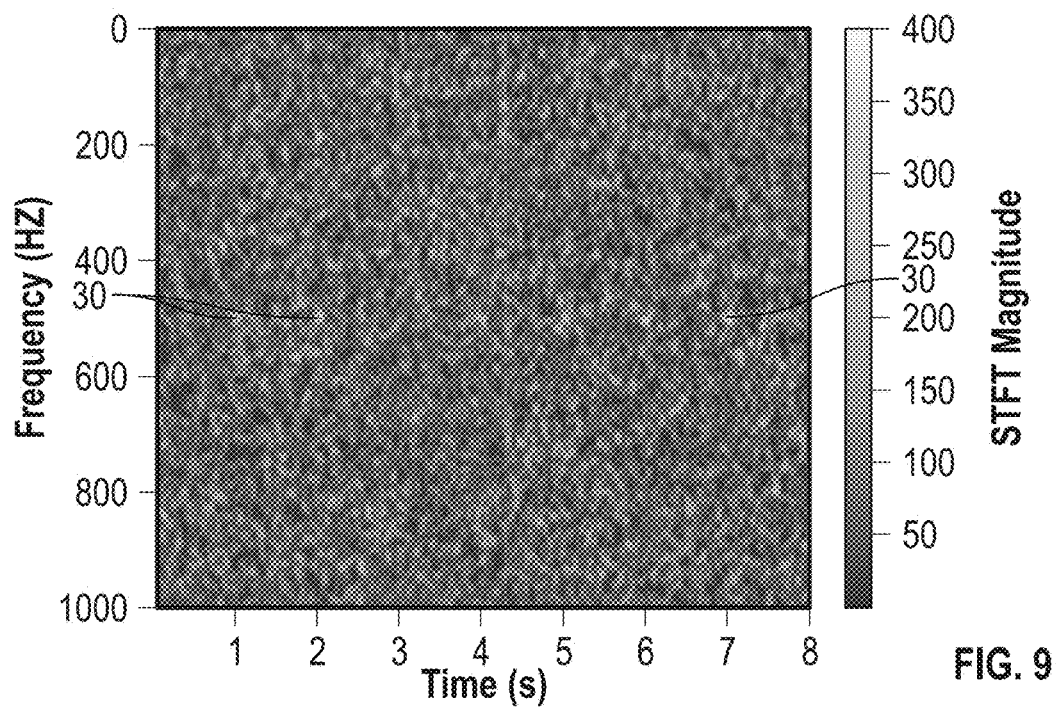
FIG. 9 is a spectrogram of a pulse signal implementation that includes noise.
Figure 10:
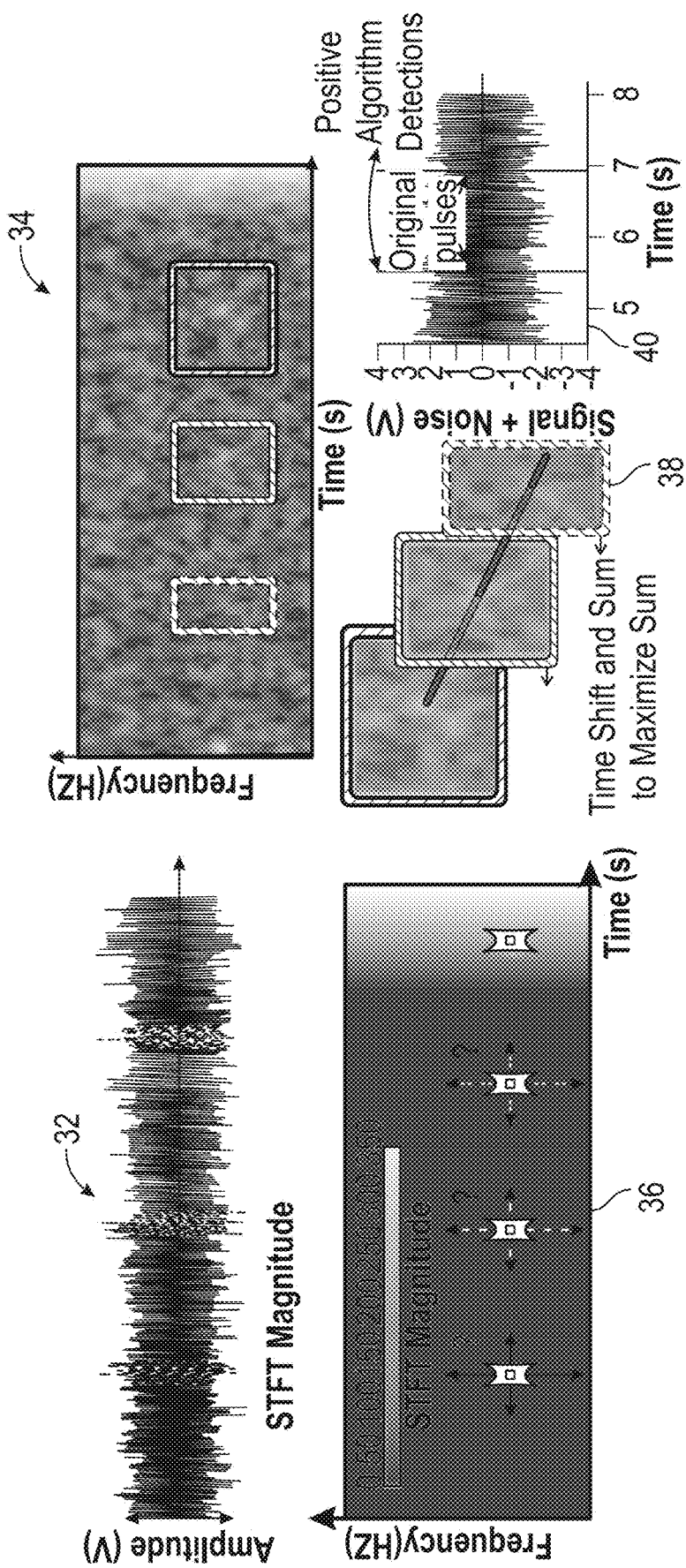
FIG. 10 is a diagram of an overview of a process implementation for time shifting and summing magnitude values of the short-time Fourier transform of three win-dowed regions of radio data to detect the time and frequency of pulses in the radio data.

FIG. 7 illustrates how the use of short-time Fourier transforms (STFTs) permits a set of time domain radio pulses to be windowed into specific short time intervals 24 and then converted into a set of frequency domain signals with local maxima 26 which then can be added and plotted in a frequency versus time spectrogram 28 where intensities on the spectrogram represent the magnitude of the frequency domain value in the z-direction coming out of the paper. FIG. 8 illustrates a spectrogram of a synthetic pulse signal without noise that shows the location of each pulse in a lighter color according to the STFT magnitude shading legend on the right indicating that the pulse is extending toward the viewer out of the paper. A more typical signal is illustrated in FIG. 9, where the pulses 30 can still be detected but are much harder to discern as their magnitude tends to blend into the surrounding frequency noise. FIG. 10 illustrates graphs that show how a time domain signal 32 at the upper right is converted to frequency domain in the form of spectrogram 34. The graph 36 illustrates how the location of each pulse is uncertain in the frequency and time directions due to noise present in the radio data received. In order to maximize the ability to detect each pulse, graph 38 shows how three windowed regions with differing size in time are time shifted and summed to maximize the ability to detect an actual radio pulse. Graph 40 then illustrates how with the detected pulse information various method implementations employ predictive algorithms to allow for detection and tracking of future pulses in the time domain. This approach helps handle automatic variations in pulse frequency and pulse repetition rates caused by variation in the components of the particular radio tag being tracked.

An overview of a more detailed presentation of a method implementation that employs the efficient algorithm discussed previously is shown graphically in FIG. 11. From the previous discussion, the method considers a discrete complex sequence r. From this, the method extracts a segment that is of sufficient length to always contain at least K pulses, including all uncertainties in initial pulse location and inter-pulse time. Each segment will contain K blocks of time windows ($B_k$) which are known through a priori predictions or shear size to each contain one pulse. In various method implementations, the method first determines the size of the segment and its block in terms of both sequence index and STFT window index.

The coherent single pulse correlation can be executed via the STFT of the segment of r, producing the matrix X (see FIG. 2). The smoothing window g can be applied during this operation in various implementations. The following discusses methods of calculating the necessary segment size to ensure K pulses are captured for processing and the selection and arrangement of time windows (w) within X to isolate individual pulses. In various method implementations, all or a subset of its frequency bins ($f_b$) may be used, reflective of a priori certainty of pulse frequency. The STFT is then computed with a time window width of $n_w$ samples in r, which is set equal to the duration of a single pulse with width $n_p$. If the fractional time window overlap is OLF, the number overlapped samples between adjacent windows would be $n_{ol}=\lceil n_w OLF \rceil$. Therefore, each window steps forward by $n_{ws}=n_w-n_{ol}$, with the time between each subsequent windows being $t_{ws}=n_{ws}/F_s$. Given these definitions, the inter-pulse time $\tau_{ip}$ can be expressed as a number of STFT windows. We would expect a repetition of a pulse after the $N^{th}$ window, or $N=\lfloor n_{ip}/n_{ws} \rfloor$. The variable $n_{ip}$ is the inter-pulse time represented as samples, or $n_{ip}=\lceil \tau_{ip} F_s \rceil$. The uncertainty of the inter-pulse time can be defined in units STFT windows rather than seconds. Assuming the inter-pulse time is known to be $\tau_{ip} \pm \tau_{ipu}$, then the location of sequential pulses would be known within $\pm M = \pm \lceil t_{ipu}/t_{ws} \rceil$ STFT windows.

In order to define the segment and block lengths necessary to contain K pulses, there is expanding uncertainty in the pulse location as the method looks forward in time. To handle this uncertainty, the method develops block and segment definitions as described here that assume no prior knowledge of the first pulse within the segment, and then modify the result for cases when the location of the first pulse can be estimated from a prior segment.

Figure 12:
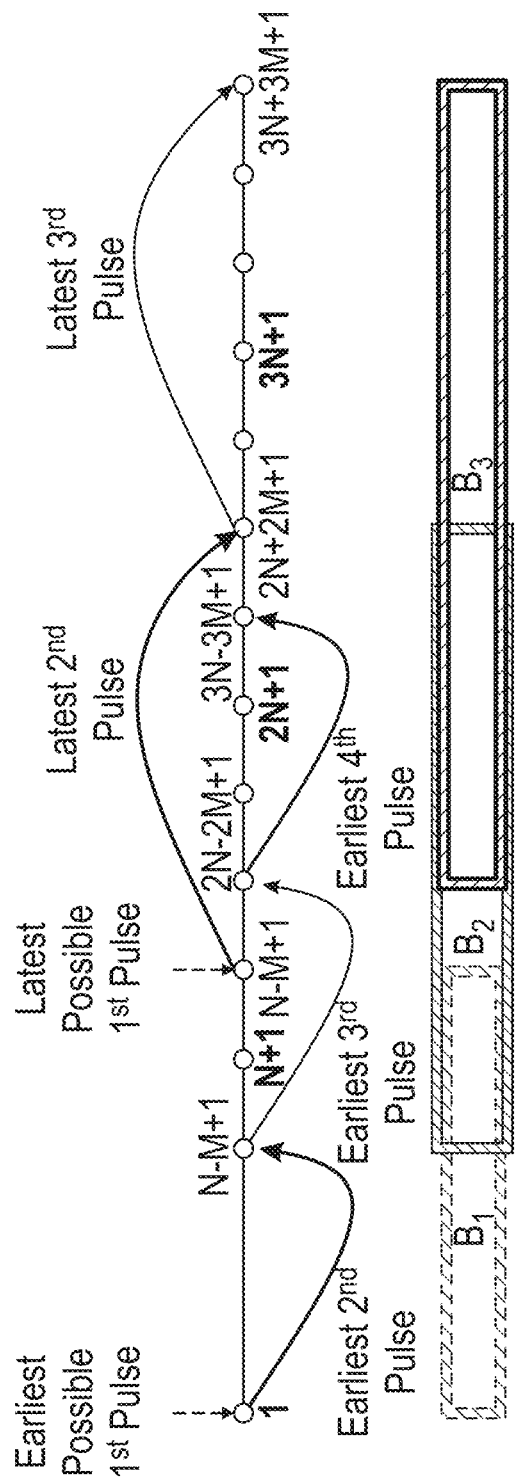
FIG. 12 is a timing diagram outlining the spacing and sequencing of various time windows used in various system and method implementations disclosed herein.

Referring to FIG. 12, with no prior knowledge, a pulse is assured to occur within the first N+M+1 time windows, which also serves as the boundary of block 1 (B1) within the segment. The first pulse could arrive at window 1 within this block, but could arrive as late as window N+M+1. From this initial range, the method implementations project forward to the earliest and latest possible arrival of the subsequent pulse. If the first pulse was early and arrived at window 1, the earliest second pulse could come at window N−M+1. If the first pulse was late and arrived at window N+M+1 the latest arrival of the second pulse would occur at window 2N+2M+1. Therefore, the second block would be defined to contain windows N−M+1 through 2N+2M+1. Using a similar process to determine the size of subsequent blocks, it is apparent that STFT segments containing K(N+M)+1 windows are needed in order to have certainty of capturing K pulses. This would represent a time band of $t_{ws}(K(N+M)+1)$ seconds or $n_{ws}(K(N+M)+1)$ samples, quantities useful in segment definitions. Additionally, generally, the kth pulse would be expected in the range of windows (k−1)(N−M)+1<w<k (N+M)+1, where w represents the window number within X. This range serves as the time window boundary of each of the K blocks within the segment.

Figure 11:
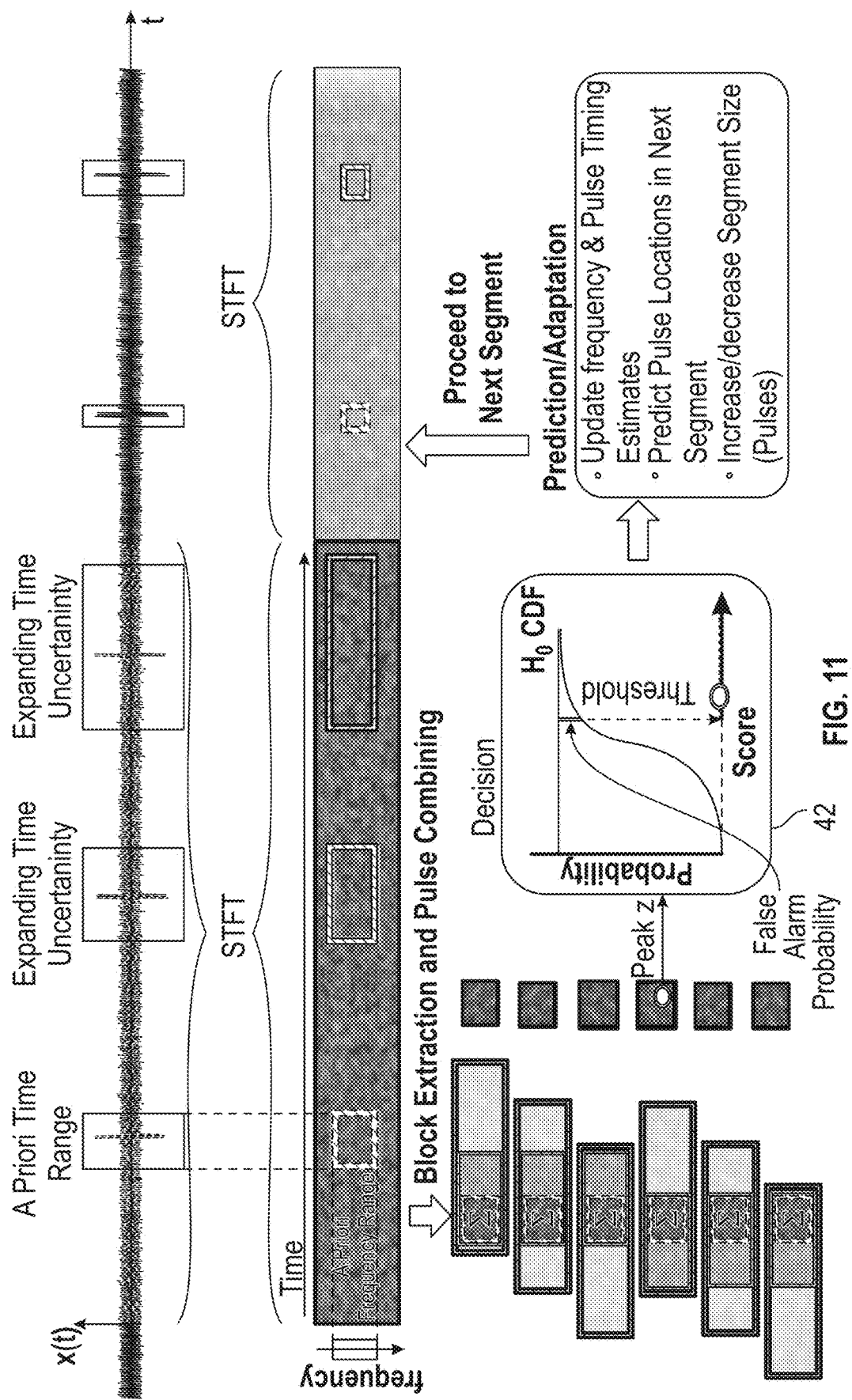
FIG. 11 is a diagram of an overview of another process implementation for time shifting and summing magnitude values of the short-time Fourier transform of three win-dowed regions of radio data to detect the time and frequency of pulses in the radio data.

In method implementations with prior knowledge (either from previous calculation or a prior knowledge), an estimate of the first pulse location within the segment can be calculated that can help to reduce the number of windows under consideration (see block size reduction in FIG. 11 between STFT segments 1 and 2.). Such a reduction serves to non-linearly reduce the subsequent computational effort. If pulse 1 is expected to be within a refined search band of time windows $p_1 \leq w \leq p_2$ then the $k^{th}$ pulse would be expected in windows $p_1+(k-1)(N+M)<w<p_2+(k-1)(N+M)$. Notice that this reduces to the previously described window band for the naïve case where no knowledge of the first pulse location is had, or $p_1=1$ and $p_2=N+M+1$.

With X computed for a segment within r, and K blocks of time and frequency $B_i$ extracted from X, the method includes implementing an efficient method of combining pulses with these blocks. Consider here that each extracted block is a matrix itself, a subset of the larger X. The method includes first computing the square of the magnitudes of each element of each block, implementing a portion of equation 11. The pulses are summed in time (the summation of equation 11) through shifting the matrices in the time window index, while maintaining alignment of the frequency bins. The method assumes, at least among the K pulses considered for the processing of one segment, that the spectral energy distribution is close to constant from pulse to pulse. This method could be extended to align pulses both in time and frequency, but may be computationally intractable for real-time processing.

Figure 13:
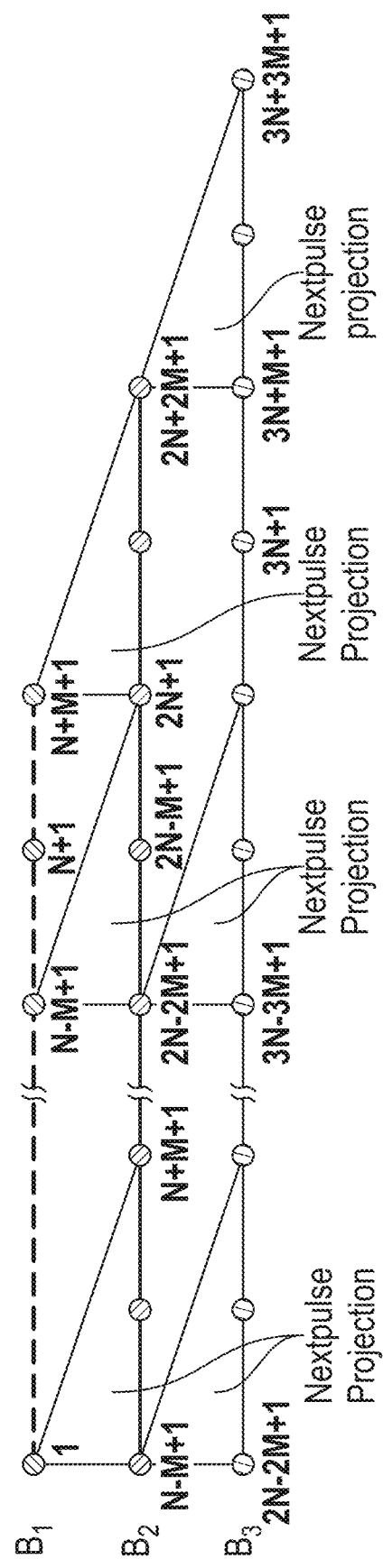
FIG. 13 is a corresponding diagram outlining notation used for the sizes of the three time windows illustrated in FIG. 12.

Referring to FIG. 13, to illustrate the concept for the case of K=3, the method first maps the time windows of each block, aligning the earliest window of each block. In this arrangement the projection of expected subsequent pulses is observed; if a pulse is located at window 1 in block 1, the subsequent pulse would be expected in block 2 between windows N M+1 and N+M+1. By inspection, block 2 would need to be shifted left (led) somewhere between 0 and 2M time windows to align the first pulse with the second. If the first pulse occurred later in $B_1$, the same amount of shifting of $B_2$ would be required to assure alignment of the pulse within $B_2$. This arrangement of time windows and uncertainty projections can be extended for any number of blocks. As illustrated in FIGS. 12 and 13, $B_3$ would involve shifts of between 0<l<2m in order to align its pulse with that of block 2.

The method now uses blocks of the STFT segment ($B_k$) to add pulse energy. In the method implementations, the goal is to temporally align the pulses so their magnitudes sum, but ensure that each possible combination is only computed once. To do so, the method first utilizes a shift-sum operation, which first column shifts one matrix by −l, $S(B_{(i,j)}, l)=B_{(i,j+l)}$, and then sums the result with a second matrix, C=A+S(B, l). Here the size of A and B need not be equal, as the sum operation is defined to occur only over the elements of A and B that overlap. Therefore, the size of C is the same as A. This operation is performed for all shifts necessary (2M+1 times in this situation), and thus produces an equivalent number of resulting matrices.

With this operation defined, the method implementations first shift-sums the last block Bx with second to last block $B_{K-1}$. The 2M+1 resulting matrices are each then shift-summed with block K−2 so on until finally shift-summing with block 1. For the case when K=3, the result of shift-summing all blocks would be $$Z_{l_1,l_2}=B_1+S(B_2++S(B_3,l_1),l_2) \quad (18)$$

where 0<l*<2M.

Each resulting Z matrix represents the sums of the magnitudes of the Fourier coefficients of the STFT blocks after column shifting, or the output of equation 11 for all ω. Notice the $l_1$, $l_2$ subscript on the Z matrix, indicating one matrix of each value of $l_1$ and $l_2$. As such, the number of matrices increases by a factor 2M+1 after each sequential shift-sum step. The number of matrices considered in each step grows nonlinearly with each step with $(2M+1)^{K-1}$ matrices used at the end of the algorithm. Given the range of each shift, there would be $4M^2+4M+1$ Z matrices for K=3. For high uncertainty (large M) or large K, this growth (exponential in K and power in M) can outstrip memory capacity, even where speed of processing is not considered, and serves as a limit on this method's final SNR improvement ability. Reductions in pulse repetition interval uncertainty may allow for a larger K, which has been shown to linearly increase the resulting SNR.

In the case where the primary transmission frequency falls between STFT frequency bins, the spreading of the energy across bins could reduce sensitivity. Moreover, to recover energy spread across bins due to the pulse duration, shape, or phase, method implementations may utilize a weighted integration across multiple frequencies in each time window in each Z matrix: a matched correlation template. Applying this template to the output as $$Z_{w,l_1,l_2,\ldots l_{K-1}} = W^H Z_{l_1,l_2,\ldots l_{K-1}} \quad (19)$$

bin weighting vector $w=[w_1, w_2, \ldots, w_i]$ in each column, but each column is circularly shifted down one row. For example, a five element w vector would generate the associated matrix $$W^H = \begin{bmatrix} w_1^* & w_2^* & w_3^* & w_4^* \\ w_4^* & w_1^* & w_2^* & w_3^* \\ w_3^* & w_4^* & w_1^* & w_2^* \\ w_2^* & w_3^* & w_4^* & w_1^* \end{bmatrix} \quad (20)$$

The length of the weighting vector is equal to the number of frequency bins (rows of Z). We denote the complex conjugate of $w_i$ here as $w_i^*$. If the general pulse shape is known, the weighting vector would be equal to the DFT of the pulse in the time domain. The application of the W matrix on Z in this way efficiently translates the template across all frequency bins.

It should be noted that in various method implementations this weighting via application of the W matrix on Z can be applied before or after the shift-sum operation. The operation in equation 18 is a sum of parts of the STFT matrix with shifting of some time windows, but it does not affect the frequency bins. As such, the STFT matrix itself could be weighted by W prior to the extraction of blocks and the application of equation 18. In fact, in various method and system implementations, doing this may be computationally expeditious, as the magnitude operation of equation 11 could then also be applied prior to the shift-sum operation. This sequence of steps converts the STFT matrix, and accordingly the blocks extracted therefrom, to real valued magnitudes. This sequence of operations may reduce memory requirements and decrease the time required for the shift-sum operations, which are the primary computation expense when implementations of the method are implemented using a signal processor.

Using these weightings, various method implementations find a maximum across all shifts and frequencies, or $$z_{w,l_1,l_2,\ldots l_{K-1}} = \max_{w \in \Omega} Z_{w,l_1,l_2,\ldots l_{K-1}} \quad (21)$$

For each shift combination $(l_1, l_2, \ldots, l_{K-1})$, a z score would be produced, resulting in $(2M+1)^{K-1}$ listing of scores, $Z_{map}$. The maximum element of $Z_{map}$ indicates which shift combination produced the highest coherence score, and therefore indicates which Z matrix should be considered. In various method implementations, the Z matrix with the highest z score is designated as $Z_{max}$. Because of the sequential summation, beginning at the last block and ending at the first, each Z matrix maintains the same relationship with frequency and time windows as the first block $B_0$. Therefore the location of the maximum within the $Z_{max}$ matrix corresponds to the pulse frequency (row in $B_0$) and time window (column in $B_0$ of the first pulse within block $B_0$. The time window of the second pulse would accordingly be $N-M+l_2$ windows greater than that of pulse 1. Other pulses could be found in a similar manner is various method implementations. With the list of candidate pulse locations, method implementations employ a decision model in order to determine the probability that each candidate is a true pulse. This decision model employs the cumulative distribution function previously discussed and as illustrated as graph 42 in FIG. 11. As previously discussed, the distribution utilized may be the Erlang distribution (see Appendix A as well). A predetermined false alarm probability (5%, 2%, etc.) may be utilized in various method implementations to help with accuracy tuning in various SNR and signal strength situations.

Figure 17:
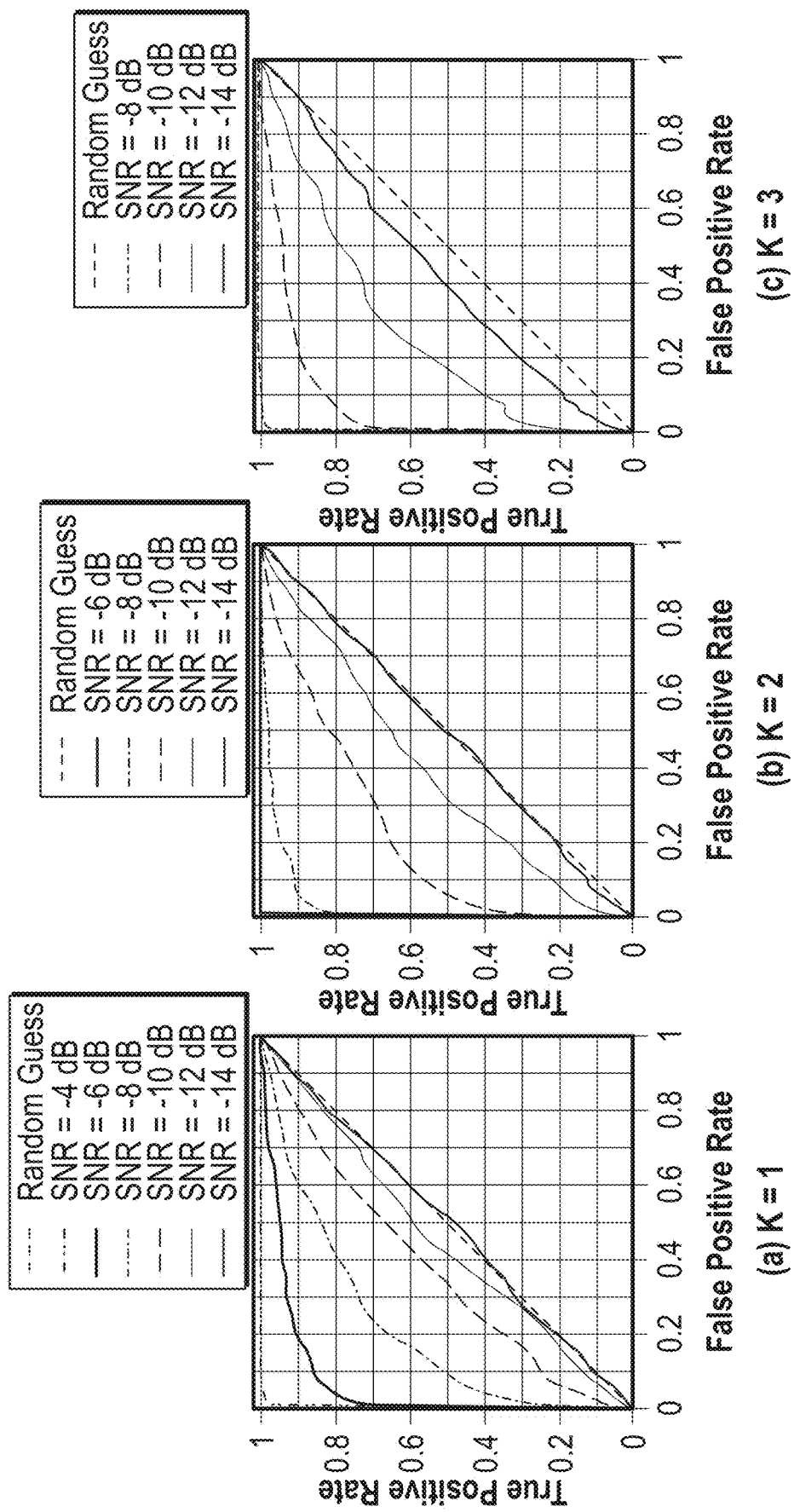
FIG. 17 are three diagrams of detection rates by SNR for one, two, and three time window method implementations.

In various method implementations, the ability to detect a true pulse is a factor of the number of blocks. Referring to FIG. 17, the performance of the method for K=1, 2, and 3 illustrated at different SNR levels and compared to a random guess. As can be seen, for K=1, an SNR of −4 dB is needed for near perfect detection, for that values is reduced to −8 dB when K=3 and three pulses are combined.

Figure 14:
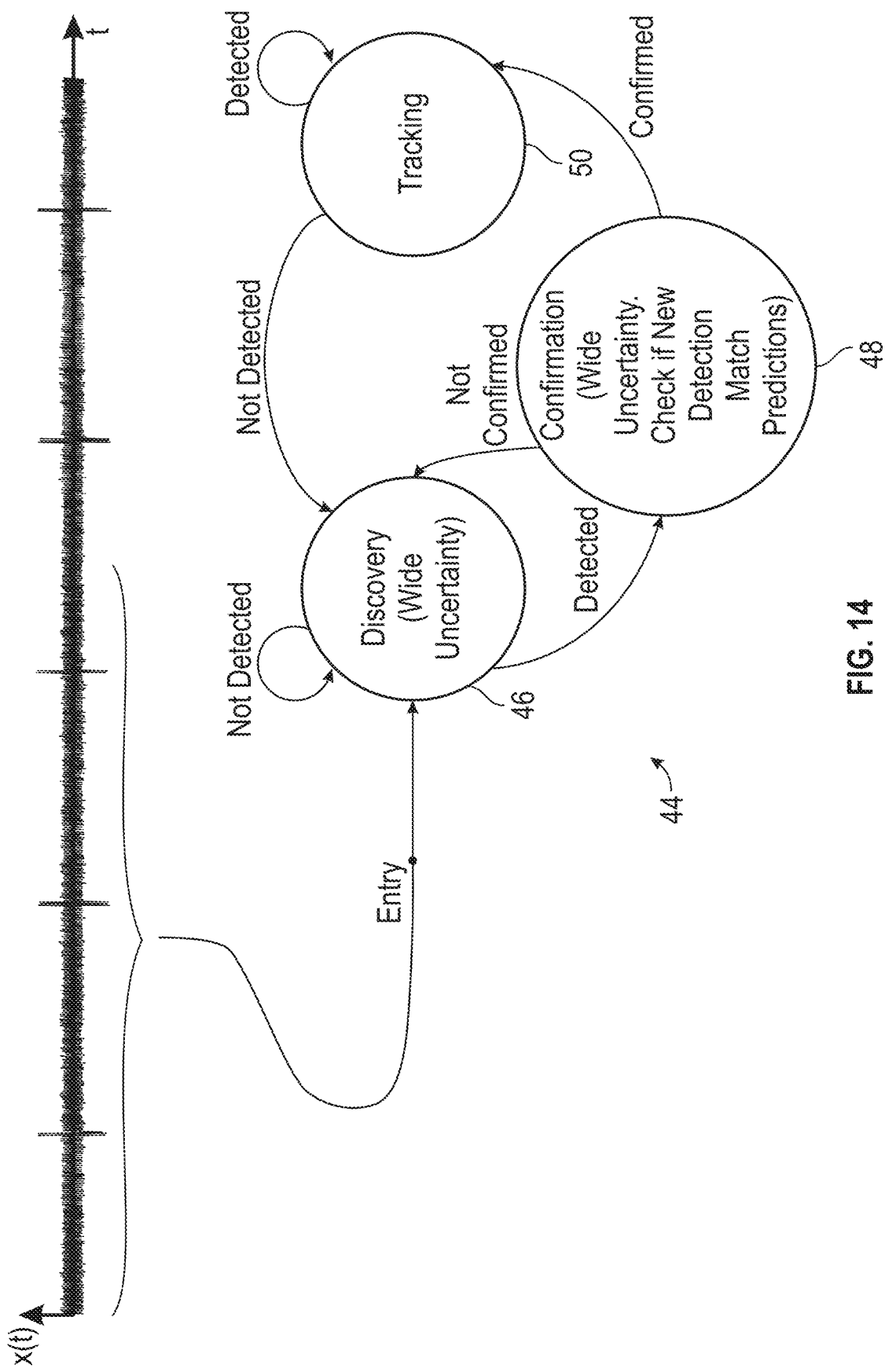
FIG. 14 is a state machine diagram of an implementation of discovering the time location of three pulses, confirming the time location, and then tracking the time location of subsequent pulses.

Following application of the detection portion of the method, detected times for the initial pulses (1, 2, or 3) can be used to predict times for subsequent future pulses. As previously discussed, with these predicted times, the system can then utilize the directional antenna and the SDR to listen and then use the radio data processing methods to identify whether pulses from the radio tag being sought appear as predicted. If so, the method can move in to a tracking phase. Referring to FIG. 14, this process is illustrated in the form of a state machine 44. During the initial entry and Discovery phases 46, the radio data is processed using the pulse time detection methods previously discussed and then the resulting candidate pulses are tested to determine whether true pulses have been detected in the Confirmation phase 48. During the Confirmation phase 48 the predicted future times for future pulses (1, 2, 3, etc.) are verified using radio data from a second pulse window. If the Confirmation phase 48 returns a confirmation that the predicted pulse times align with the actual pulse times of the newly received pulses, then the state machine 44 enters a Tracking phase 50 where the prediction of pulse timing continues to run followed by confirmation/verification of each pulse as it is received.

Figure 15:
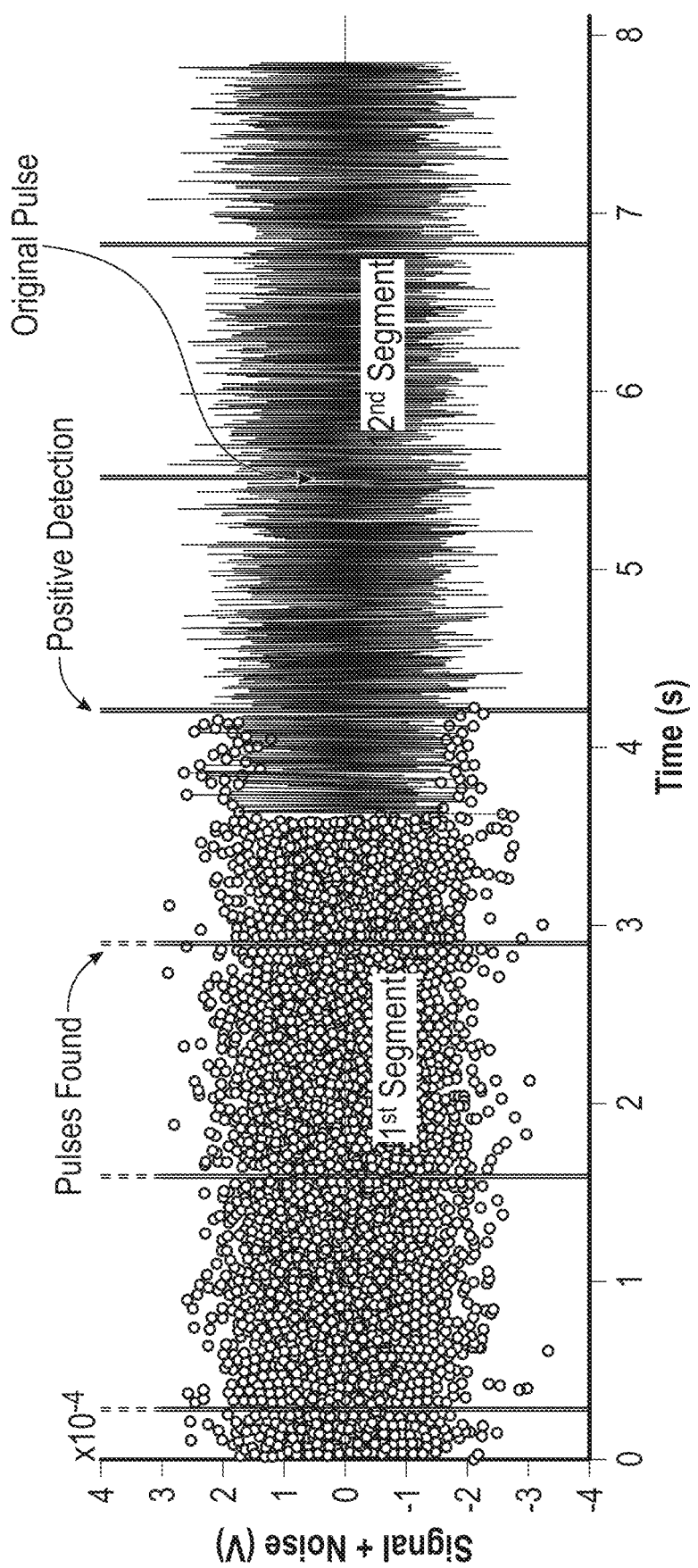
FIG. 15 is a graph of a series of six pulses detected in an artificial pulse signal at a signal-to-noise ratio (SNR) of −18 dB at 48 kHz sampling.
Figure 16:
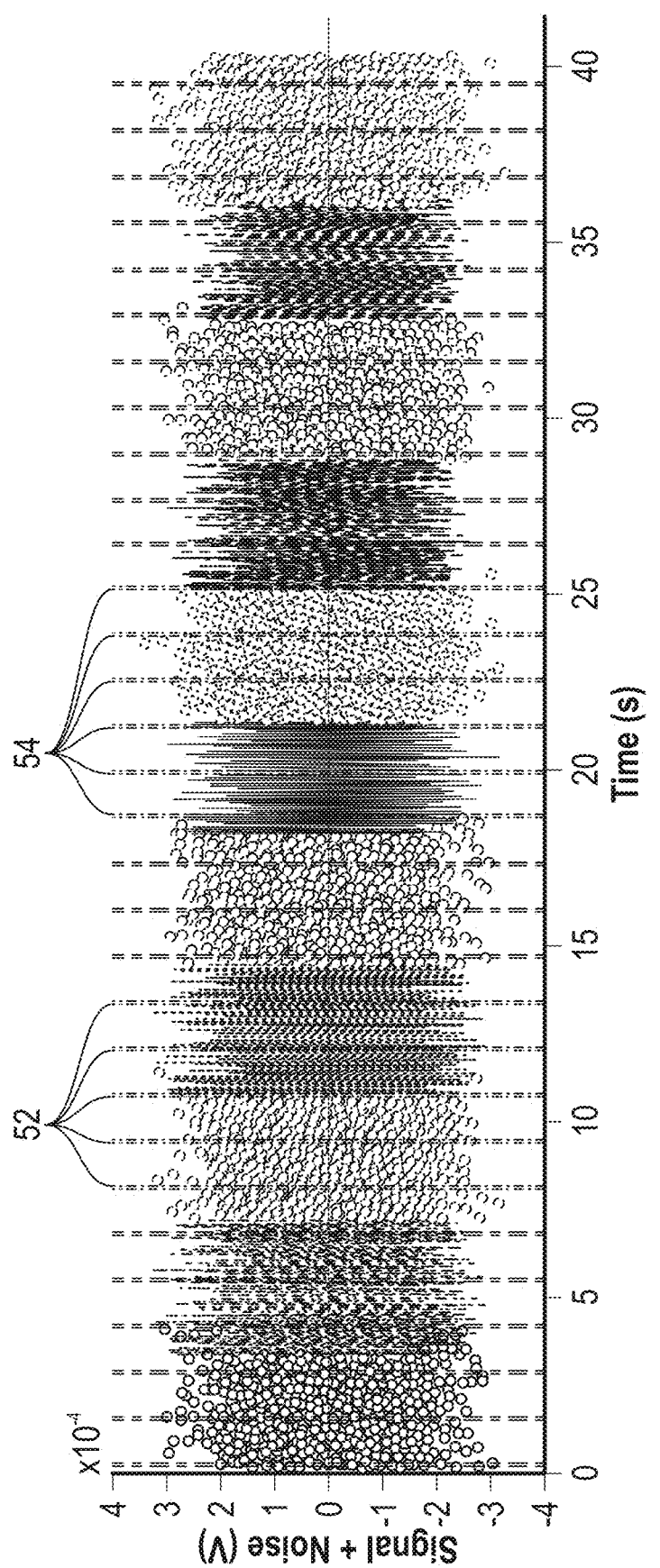
FIG. 16 is a graph of a series of 30 pulses detected in an artificial pulse signal at an SNR of −20 dB at 48 kHz sampling.

FIG. 15 illustrates an example of detection of pulses from a simulated signal that had 6 pulses with white noise added to create a SNR of −18 dB sampled at 48 kHz. The pulses were divided into two segments with the first three pulses used in the first segment to predict the timing of the next three. As illustrated, the method implementation found all six pulses in the signal. FIG. 16 illustrates another simulated signal that contained 30 pulses with white noise added to create an SNR of −20 dB sampled at 48 kHz. As illustrated, the method and system implementation found all of the pulses, but classified pulses 52 and 54 as noise. This experiment demonstrated a performance limit for this implementation at the SNR of −20 dB at 48 kHz (−6.6 dB at 4 kHz sampling). For comparison, a human expert's detection limit is between −15 to −16 dB at 48 kHz meaning the system is able to improve detectability at about 4 to 5 dB which represents a 2-3× improvement in sensitivity over the manual radio approach.

The detectability of various radio tag signals is a function of the sampling frequency in various method implementations. For example, where 4 kHz sampling is used, for detectability to be effective, the radio tag's center frequency needs to be within +/−2 kHz of the tag's frequency (149.998 MHz<150 MHz<150.002 MHz. However, at higher sampling rates, the deviation from center frequency can be much higher as recording at 48 kHz permits ranges as large as +/−24 kHz to be used.

Once the pulses are identified and system is able to track the radio tag with radio data, various method implementations may be employed to identify a bearing (direction) to the radio tag identified and tracked. The use of UAV system implementations like those disclosed herein may be particularly useful in assisting the signal processor of the base station in identifying bearings using various flight patterns involving waypoints for radio data collection. Various examples of these will be discussed further in this document.

The manual radio DOA search method (azimuthal scanning) of scanning circularly at a given location is implemented using the UAV by rotating the UAV in place as it hovers at a waypoint, scanning in yaw for a predetermined time period. In various implementations, six rotations at 25°/s have been used, resulting in 65 received pulses at each waypoint for a 1.32-s tag pulse interval. While this results in data collection times of 1.5 min per waypoint, other method implementations may use less time per waypoint with little effect on error.

After processing of the radio data received at each waypoint to identify the pulses in the data, a bearing estimate is needed. Simply taking the bearing of the maximum pulse amplitude is susceptible to errors and noise in the antenna orientation and the received power measurements. Implementations of methods of detecting a radio tag like those disclosed in this document may utilize principal component analysis (PCA) to leverage all received pulses at a waypoint. PCA is a method of determining the set of axes in a dataset for which the data have the largest variance. The method first determines the pulse power relative to an earth-fixed reference frame from the antenna frame. After developing this data matrix, the method utilized a PCA analysis to determine the direction of the received signal. It is important to note that, as PCA can be thought of as fitting an ellipsoid scattered data, a complete 360° scan of each axis of interest is generally necessary.

During a PCA analysis, the method assumes the UAV has collected a sequence of n pulses, each with a strength metric Pi and a synchronized antenna heading ($\psi a,i$), pitch ($\theta a,i$) and roll ($\phi a,i$). The strength metric could be the signal power (in mW or dB), but must be positive. The signal amplitude or signal-to-noise ratio could also be evaluated in various method implementations. In this method implementation, the pulse power (mW) is used, and then normalized by the minimum pulse power at that waypoint. The resulting linear scaling of normalized power (mW/mW) was noted to provide lower errors than a log scaling in field tests, but other directional antennas may show improved errors with alternate scalings. In this method implementation waypoint-average pulse strengths scale coefficients and vectors were used, so datasets were interpolated over a uniform angular grid if there is significant angular non-uniformity in the original spacing.

The pulse strength metric Pi measured in the antenna reference frame is transformed to an earth-fixed frame through Euler rotations. If the antenna and vehicle frames are aligned and the vehicle performs a hovering yaw scan, the transformation consists of a single z-axis rotation using the vehicle's heading angle (vi). In this case, the result of the transformation is a pulse vector whose magnitude is equal to the original measured pulse strength, but expressed with x (+North) and y (+East) components in the earth frame: $\vec{P}_{e,j}=[P_i \cos\psi_{v,i}, P_i \sin\psi_{v,j}]^T$. The transposed individual pulse vectors $\vec{P}_{e,j}$ can be concatenated into $$P_e^* = \begin{bmatrix} \vec{P_{e,1}^T} \\ \vec{P_{e,2}^T} \\ \vdots \\ \vec{P_{e,n}^T} \end{bmatrix} \quad (22)$$

If the vehicle or antenna are rotated by all three angles, $P_e$ would be an n×3 matrix of row vectors of $P_i$ in the earth-fixed frame, with the x, y and z components in the first, second and third columns respectively. More typically, roll and pitch are zero, so only the first two columns (x and y components) of $P_e$ are needed. The asymmetric gain pattern of many antennas will result in nonzero column averages of this matrix, yet PCA requires a zero-mean dataset. Subtracting each column average from that column mean-centers the dataset (see equation 23).

$$P_e = \left(1 - \frac{1}{n}J\right)P_e^* \quad (23)$$

Here, I and J are the n×n identity matrix and matrix of ones respectively. With the Pe data matrix now defined, its principal components are determined. The PCA method uses a singular value decomposition ($P_e = U\Sigma W^T$) of the data matrix. The axes of highest variance are defined by the right right singular vectors W. The orthonormal vectors of each column of W represent the unit vectors of the principal axis of Pe. The column, and therefore axis of highest variance, is that which corresponds to the largest singular value as defined by the diagonal elements of $\Sigma$. Thus, this primary singular vector $\vec{w}_i$ can provide a DOA.

The sum of the variances of the pulse powers along each principal axis can be shown to be proportional to the square of the singular values defined in $\Sigma$. In this way, the relative magnitudes of the singular values can be used as a metric for the degree of directionality of the received pulses. If signal strength is equal in all directions, the singular values will all be equal, and thus, no directional information can be obtained from the data. Conversely, if the first singular value is significantly larger than the second, the column of W associated with the first singular value will provide a good measure of the direction of the signal origin. The axis with maximum variance is defined as $\vec{w}_1$, with a singular value of $\sigma_1$. The second largest singular value $\sigma_2$ can be compared to the largest to provide a metric of certainty of the direction estimate provided by $\vec{w}_1$ using $$\tau = 1 - \frac{\sigma_2^2}{\sigma_1^2} \quad (23)$$

Thus, τ=0 when the data has equal variance along the first and second principal axes. Field testing has shown that as t values fall to less than ~0.3, bearing errors begin to increase significantly.

To determine the proper direction (0° or) 180° along $\vec{w}_1$, the direction of average received pulse power is used when the antenna gain pattern is asymmetric. If the average pulse power vector is $$\vec{P}_{avg} = \frac{1}{n} P_e^T \vec{j} \quad (24)$$

where $\vec{j}$ is a n×1 vector of ones, then the sign of the primary singular vector can be corrected to point in the direction of the average signal power vector by multiplying it by the normalized dot product of the average power and primary singular vector, yielding $$\vec{w}_p = \frac{\vec{P}_{avg} \vec{w}_1}{\|\vec{P}_{avg}\| \|\vec{w}_1\|} \vec{w}_1 \quad (25)$$

The average power of the pulses $\vec{P}_{avg}$ provides a way to assess certainty as to the direction along the principal axis.

Figure 23B:
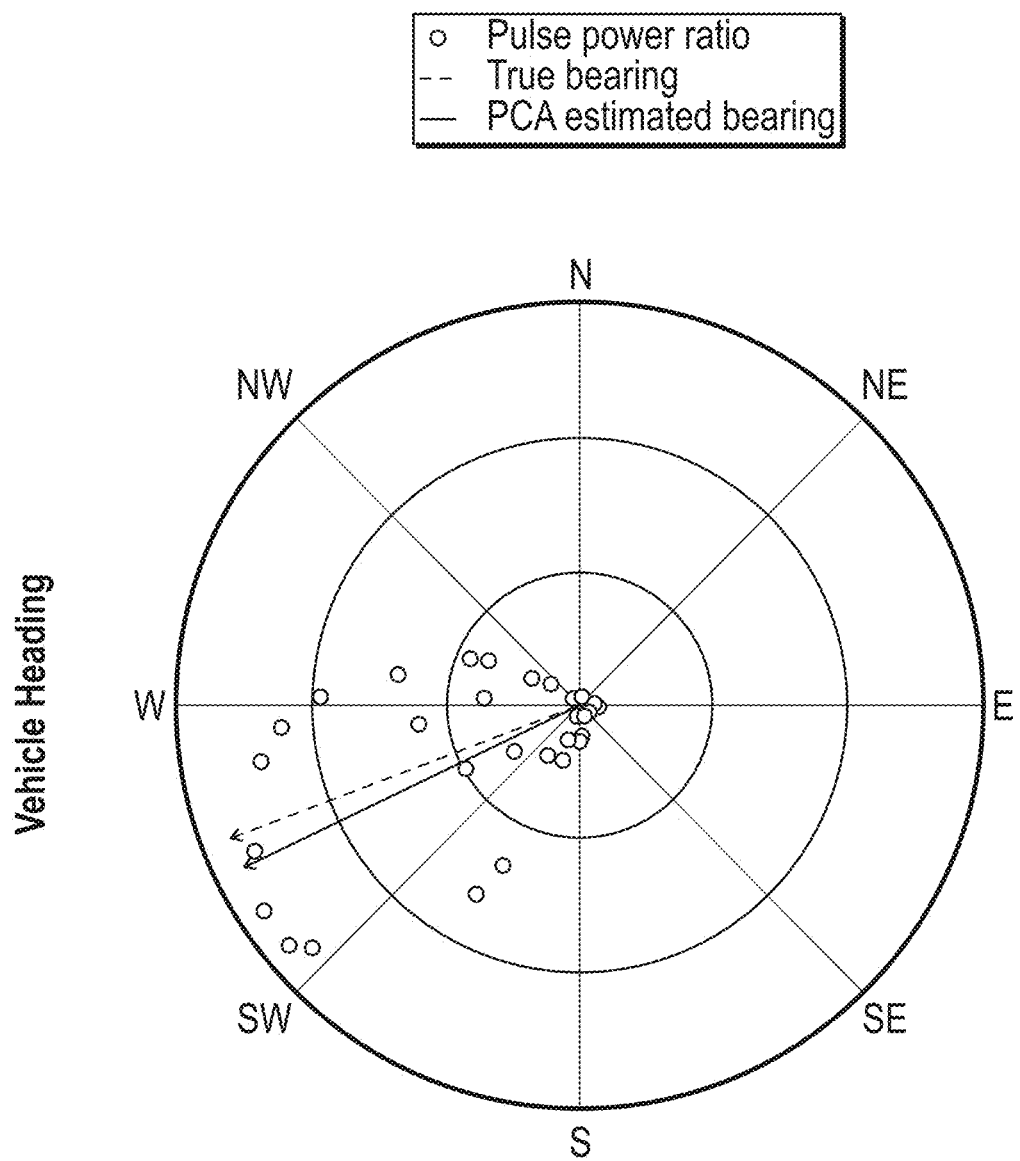
FIG. 23B is a polar plot of the data of FIG. 23A showing an estimated bearing from principal component analysis and a true bearing.

An example of the results of a PCA analysis plotted on a polar plot can be seen in the example of FIG. 23B where the PCA estimated bearing closely correlates with the true bearing.

Given a set of bearing vectors from the PCA analysis and the associated positions from which they were measured, methods of detecting the position of a radio tag this information to estimate the location of a tag. The outputs of the PCA bearing estimates can be used in any number of source location estimators in various implementations, such as, by non-limiting example, maximum likelihood estimator (MLE), repeated median regression (RMR), M-estimator technique. In some implementations, localization programs such as LOCATE, TRIANG and LOAS can be utilized to assess localization errors from the UAV bearing estimates. In particular implementations, an estimator that uses the recorded pulse amplitudes to weight each bearing to highlight how signal strength can be exploited for localization. The method is based on the idea of a center of mass (CM).

The CM method implementations first find the (x, y) intersection points of the bearing line emanating from each waypoint with that of all bearing lines. This creates $(n^2-n)/2$ intersection points, where n is the total number of waypoints. Each of these points is weighted; our weighting is based on the idea that waypoints with stronger signals should have more influence on the estimated position. The weighting $b_i$ is the product of the average pulse amplitudes from the two waypoints that generated the $i^{th}$ intersection. The method discards points whose parent lines were less than 30° apart, as localization errors from bearing errors become large when the bearing lines approach parallel. It has been observed that errors increase significantly for angles less than 20°, so discretion is needed to balance localization errors with the constraints of flight distance and range to the tag in various method implementations. Waypoints would thus ideally be separated by distances greater than 0.35× the expected range to the tag. The method also eliminates points that are based on bearings whose t values are less than 0.35.

The resulting xi and yi intersections, and their corresponding weights (bi), can be used to find an estimated location using a weighted average similar to the CM of discrete particles.

$$\begin{bmatrix} X_{est} \\ Y_{est} \end{bmatrix} = \frac{1}{\sum_{i=1}^{m} b_i} \sum_{i=1}^{m} b_i \begin{bmatrix} x_i \\ y_i \end{bmatrix} \quad (26)$$

Figure 18:
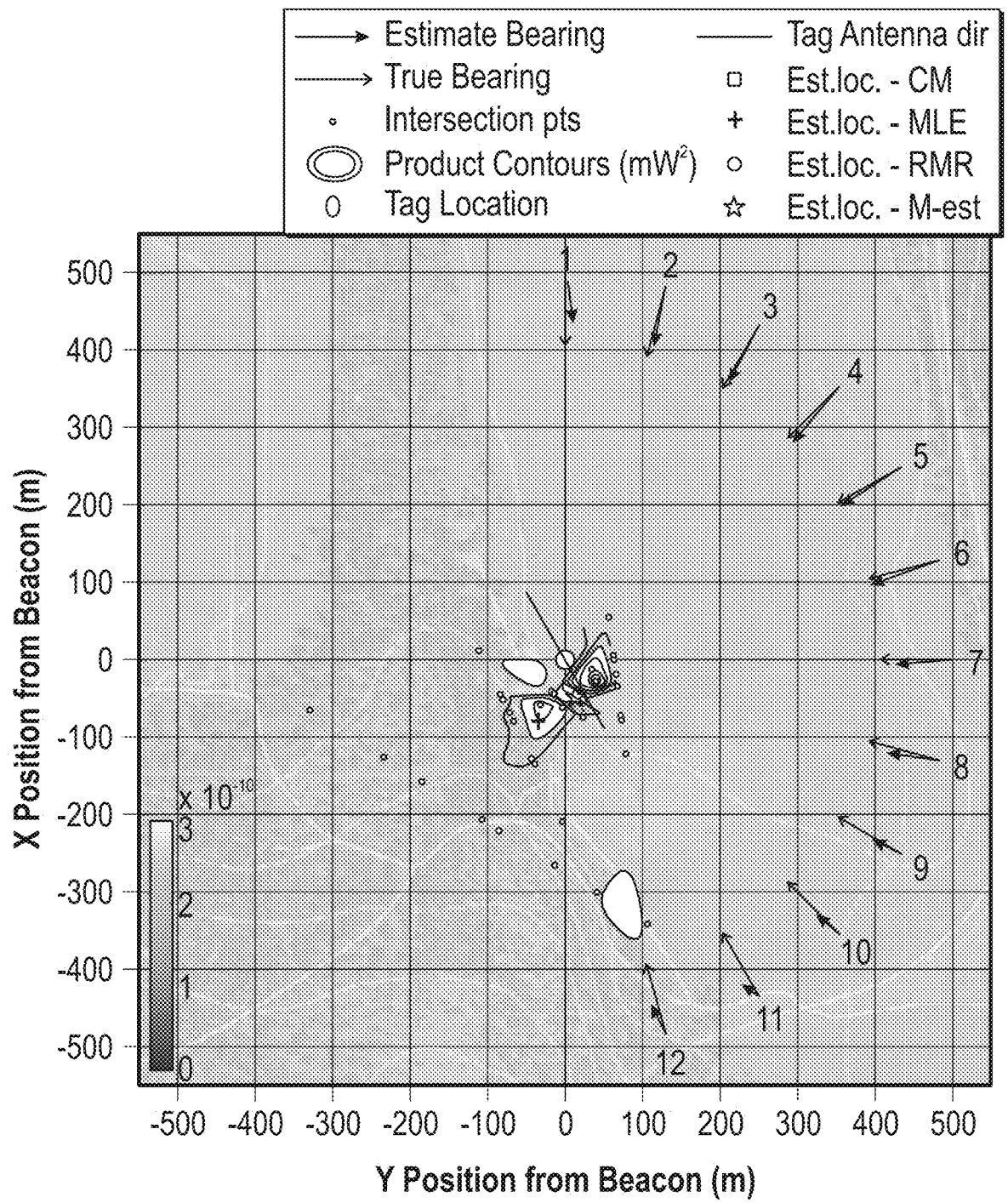
FIG. 18 is a diagram of a localization test and bearing results for a UAV test involving 12 waypoints.

Various field tests were performed using a UAV system implementation like that disclosed herein and employing implementations of the method of detecting a location of a radio tag like those disclosed herein. Referring to FIG. 18, the results of such a test where the radio tag was placed 1 m above ground and the UAV was flown at 122 m with 12 waypoints with a radius of 500 m from the tag with 6 spins conducted at each waypoint at a 25 degree/sec spin rate. The configuration was a DOA configuration. The results of the localization indicate that the predicted location of the radio tag was off by 45-87 m representing a 9-17% error.

Figure 19:
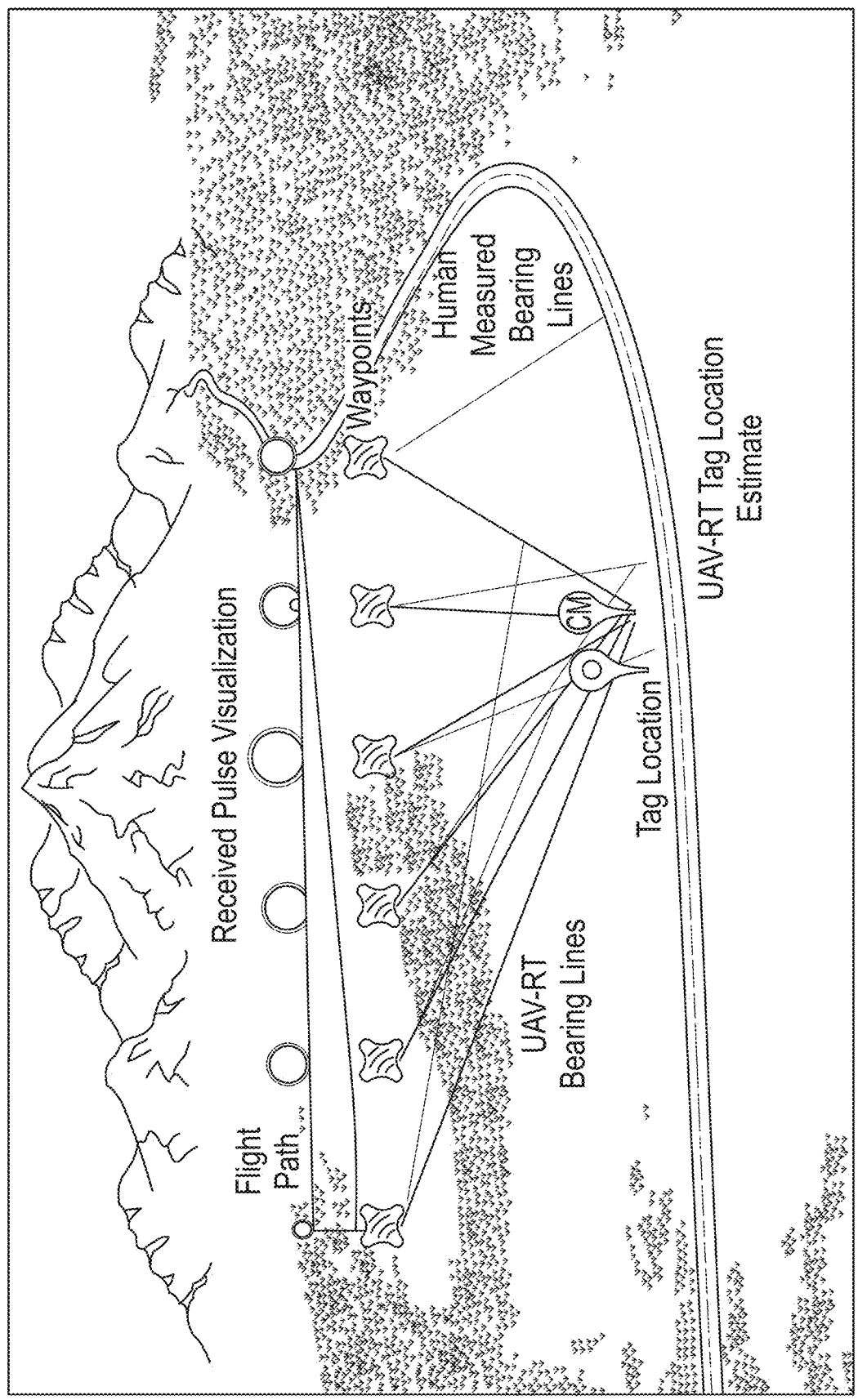
FIG. 19 is a diagram of another localization test utilizing a UAV with bearing results calculated by a system implementation like that disclosed herein compared to bearing results determined by a human operated system at multiple waypoints.

FIG. 19 demonstrates the results of a second comparative test between the performance of a human operator using a manual radio method compared to the use of the system and method implementations disclosed herein. A series of 6 waypoints were worked by both the human and UAV with the UAV flight path data pulse visualization represented by the size of the circles above each waypoint. On the diagram the thicker lines are the bearing lines calculated automatically by the base station signal processor using the radio data from the UAV during flight; the thinner lines are those measured by the human operator based on working each of the waypoints by ear. When averaged, the human bearing error was 5.1 with a position error of 26 m (4.9%) while the UAV system had a bearing error of 2.3 with a position error of 72 m (14%). This being said, it is apparent by inspect ion that the bearing lines from the UAV would more predictably allow a user to locate the radio tag no matter which waypoint was used while several of the human bearing lines drawn at a couple of the waypoints would simply not allow a user to reach the vicinity of the radio tag at all.

Figure 24A:
FIG. 24A is a diagram of a first portion of a software graphical user interface.
Figure 24B:
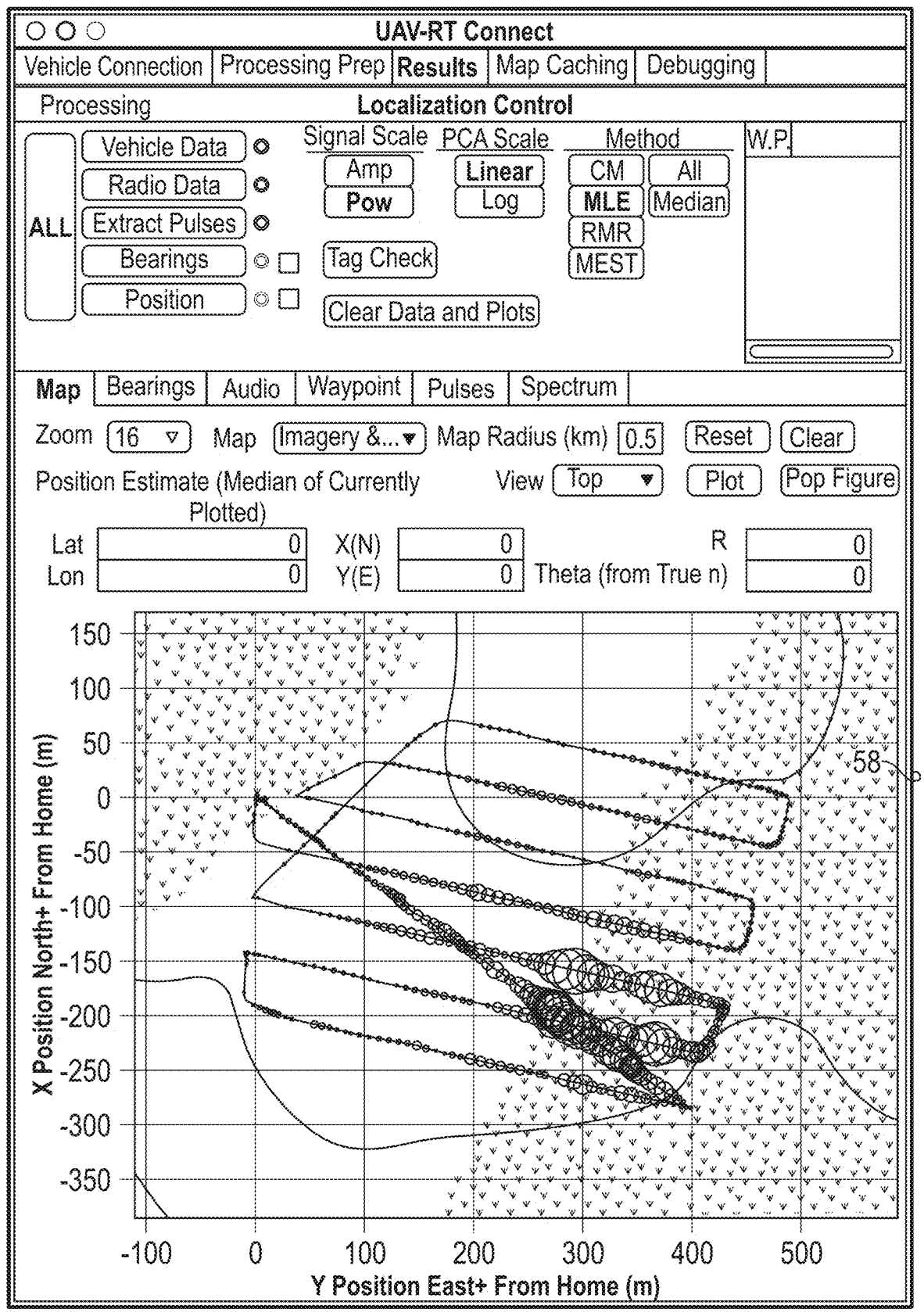
FIG. 24B is a diagram of a second portion of a software graphical user interface.

Various system implementations of base stations may utilized various graphical user interface designs used to assist the user with preparing and guiding the UAV and setting the various waypoints along with adjusting various parameters used in methods of detecting pulses, determining bearings, and locating a radio tag. An example implementation of such a graphical user interface is illustrated in FIGS. 24A-24B. In FIG. 24A, section 56 is used to aid in setting parameters associated with the various methods of detecting pulses disclosed herein. The graph 58 in FIG. 24B allows for ready visualization of the received pulse intensity/energy by geographic location during a UAV flight and shows the various waypoints/flight path of the UAV post flight. A wide variety of graphical user interfaces and method and system implementations may be constructed using the principles disclosed herein.

Where method and system implementations are utilized to process tags with different PRI, uncertainties, or pulse widths, complete reprocessing of the radio data set collected by the UAV during a flight may be required. However, processing radio tags that do not have differences in center frequencies, pulse frequencies, pulse widths, or other uncertainties may be challenging because the method implementations disclosed herein use found pulses to reduce the uncertainty for finding additional pulses to permit realtime processing to occur. In various method implementations, a way to handle this situation would be to identify the various tags while processing a first time interval (segment) but then focus on just one of the tags in each subsequent time interval during a first round of processing. The radio data can then be reprocessed to focus on a second radio tag so that bearings to the second tag can be generated as they were generated for the first radio tag. Some method implementations could utilize computer processing techniques to allow specific central processing unit (CPU) cores to be assigned to each radio tag detected in the radio data so that the processing could proceed simultaneously. However, in other implementations, it may be sufficient to simply reprocess the data serially focusing on one tag at a time to generate the bearing and location information desired.

While the various system and method implementations disclosed herein have been described using examples where the radio tags are adapted for use for wildlife tracking, the principles disclosed herein can be utilized for tracking any of a wide variety of other radio tags that involve other frequencies and pulse repetition rates. Other vehicles used other than UAVs for carrying the direction antenna utilized for receiving the radio signal from the various radio tags.

Various methods of detecting a plurality of radio pulses are disclosed in this document that involve predicting and verifying the position of the radio pulses in a spectrograph. Additional methods of detecting a plurality of radio pulses are disclosed hereafter that involve discovering a pulse train that includes a plurality of pulses and combining pulses to assist with improving signal-to-noise ratio (SNR). These methods may be employed in wildlife tag detection, but they may also be employed in any other application where a pulse train of radio pulses needs to be detected. Various method and system implementations that may be employed are disclosed in the paper to Shafer et al, entitled "Asymmetric Communication Signal Processing in Wireless Networks with Minimum-Complexity Edge Nodes" filed herewith as Appendix B, the disclosure of which is hereby incorporated entirely herein by reference.

Figure 25:
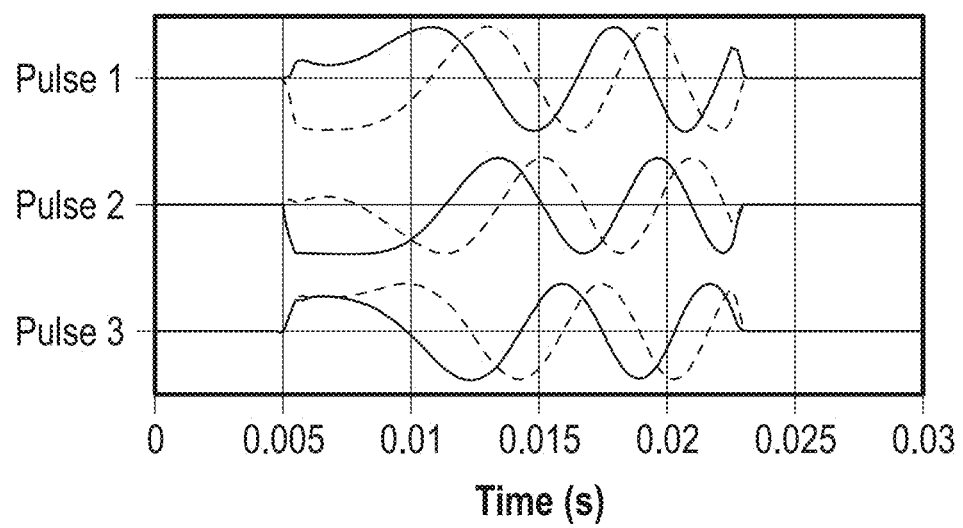
FIG. 25 is a graph of three sequential pulses generated by the same wildlife tracking tag.

Referring to FIG. 25, a graph of three sequential pulses generated by the same wildlife tracking tag is illustrated that shows how the initial phase of each pulse varies significantly pulse-to-pulse and how each pulse is a quasi complex exponential. The specific tag used here is one marketed under the tradename LB-2X by Holohil Systems Ltd. of Carp, Ontario, Canada. This tag demonstrates approximately 1 kHz bandwidth transients and random phases followed by quasi complex exponential waveforms with slightly non-linear phase trajectories. In FIG. 25, the quadrature component of each phase is illustrated in dotted lines. As the method implementations disclosed in this document work to combine pulses, the methods may be referred to a quasi-coherent. Various implementations of wildlife tags have a nominal pulse repetition rate of about 1 to about 1.3 seconds. In various method implementations, the detection of one to three pulses is used in a field setting where any of the previous disclosed methods and systems for detecting a wildlife tracking tag may be used in order to assist with managing air time for a UAV involved in the search. However, the same principles may be employed in various methods during offline post-field review of collected data seeking detection of more than three pulses for a wildlife tracking tag during further investigation.

As with the other system and method implementations disclosed in this document, a software defined radio (SDR) is employed to receive radio signals and convert them to a wideband intermediate frequency signal at a sampling frequency of $T_{IF}^{-1}$. Because in various implementations, up to three pulses with a pulse repetition rate of about 1 second, the stream of data associated with the wideband intermediate frequency signal is separated into segments of about 4 seconds each (each segment being long enough to potentially include three pulses).

A method of detecting a set of pulses in a segment may be derived as follows. Let $i=\sqrt{-1}$. A single pulses of duration L samples indexed in time by $nT_{IF} \to n$ can be represented by Equation 27:

$$p_{IF}[n;\delta,\theta] = a_L[n-\delta]e^{j\phi_{IF}[n-\delta]} \quad (27)$$

where $$a_L[n] = \begin{cases} a[n], & n \in \{1, 2, \ldots, L\} \\ 0, & \text{otherwise} \end{cases}$$

and where $\delta$ is a delay from the start of a segment and $\theta=\{a[n], \phi[n]; n\in\{1, 2, \ldots L\}\}$ captures the intra-pulse features—the magnitude sequence $a[\bullet]$ and the phase trajectory $\phi_{IF}[\bullet]$.

Given that the time duration of each segment has been determined with prior knowledge of the possible maximum number of pulses that could be included in each segment, this information can be included in the model. Since the number of pulses in each segment and the likely location of each pulse within each segment are thus known up to a degree of uncertainty, each of the segments $n_s$ may contain K full pulses, K full pulses and a portion of an additional pulse, or K+1 full pulses. Defining a tag for the pulses as i, the tag's pulses can be indexed as $k=1, \ldots, K+1$. The starting sample of pulse k is thus followed by the starting sample of pulse k−1 by $\gamma_k^i$ samples representing the inter-pulse sample time where $\gamma_1^i \equiv 0$.

The delay from the start of a segment to the first pulse of tag i can be defined as $\delta_i$ and $\theta_k^i$ is defined as the intra-pulse features of pulse k of tag i so that pulse k of tag i is can be represented as follows in Equation 28:

$$p_{IF}[n;\delta^i+\Sigma_{j=1}^{k}\gamma_j^i,\theta_k^i] \quad (28)$$

Letting $[\bullet]_{n_I}^{n_I+n_S-1}$ be the operator that selects elements $n_I, \ldots, n_I+n_S-1$ by cleaving the vector of each segment represented with a length of $n_S$ that is taken from the incoming I/Q data stream from the SDR. The pulse set on the cleaved vector for tag i in the segment can be expressed as a vector in the form of Equation 29:

$$S_{IF}(\delta^i,\gamma^i,\Theta^i) = [\Sigma_{k=1}^{K+1} p_{IF}[n;\delta^i+\Sigma_{j=1}^{k}\gamma_j^i,\theta_k^i]]_{n_I}^{n_I+n_S-1} \quad (29)$$

The parameters of the pulse train represented in the pulse set are a priori uncertain. In the situation where the pulse train is being generated using a wildlife tracking tag that is emitting a train of pulses like those illustrated in FIG. 25, the device has minimal circuit complexity. In this tag's circuit, the inter-pulse interval is created by a timing circuit that charges and discharges a capacitor through a resistor using a transistor. Variations in component manufacturing, circuit assembly, parasitic effects resulting from the same, temperature, and surrounding radio noise causes the inter-pulse interval to vary around short-term and long-term averages. Because the degree of variability of these factors tends to be random, the use of random variables in modeling is appropriate. The vector $\gamma^i=\{Y_k^i\}_{k=1}^{K+1}$ is a vector of up to K+1 random variables that characterize the inter-pulse intervals. The vector $\Theta^i=\{\theta_k^i\}_{k=1}^{K+1}$ is used to capture the intra-pulse features resulting from the variability.

The outcomes of these random variables form a set of hypotheses in an M-ary detection problem in the case of a single tag signal. As will be demonstrated later, when these random variables are appropriate discretized into a finite set, the variables can be used to form correlation templates matched to all possible received pulse train signals. The noisy received signal for the pulse trains of all tags as indexed by i in the cleaved segment is the vector of Equation 30:

$$r_{IF} = \Sigma_i r_i + n_{IF} \tag{30}$$

where $$r_i = s_{IF}(\delta^i, \gamma^i, \Theta^i) \tag{31}$$

and $n_{IF}$ is a vector of zero-mean circularly-symmetric complex noise with a covariance matrix $\Sigma = E[n_{IF} n_{IF}{}^H]$. In this equation, $n_{IF}{}^H$ is the conjugate transpose of $n_{IF}$ and $E[\bullet]$ is the expectation.

The resulting model of the wideband intermediate frequency signal can then be used in pre-processing of the signal to form channelized segments in various method implementations.

The various system and method implementations used for detection of pulse trains utilize two stage processing: an initial nearly phase-coherent match filtering/correlation of the individual pulses followed by non-coherent combining of multiple pulses both performed jointly to take advantage of the SNR improvements provided by multi-pulse combining. In various implementations, the signal-pulse correlation may not be a perfectly matched filter because the pulse waveform(s) themselves are not perfect complex exponential(s). However, the inter- and intra-pulse features of each pulse are not known a priori and each of these features has a different type and degree of uncertainty associated with it. Handling the uncertainty involves performing an effective search of the time-frequency plane for a set of pulses that yields a maximum signal contribution. This search can be aided by features of the particular pulse train being searched for. In the case of the pulses illustrated in FIG. 25, since the pulses are quasi sinusoidal and their center frequencies are highly correlated, these features can aid in identifying these pulses amid the noise present in the channelized segments.

Because the search involves both time and frequency domains, the channelized segments are transformed using a short-term Fourier transform (STFT) to generate a spectrogram of each of the channelized segment. The STFT can be viewed in two ways, first, as a collection of joint temporal/spectral filters, or as an overlapped block transform yielding a temporal/spectral decomposition. Following creation of the spectrogram of each of the channelized segments, the various method implementations disclosed herein carry on pulse train detection by pre-processing the intermediate frequency signal, performing coherent single-pulse correlation, performing non-coherent multi-pulse combining, and then utilizing a threshold-based decision making process to confirm (or deny) presence of a desired pulsed radio signal in the spectrogram.

During pre-processing, because the wideband intermediate frequency signal from the SDR frontend contains multiple tag signals at different frequencies a polyphase fast Fourier transform (FFT) analysis filter bank operated using a signal processor can be used in various system implementations to channelize the signal into multiple downconverted narrowband signals. The use of the FFT filter bank works to attenuating out-of-band noise and interfering energy from other tag signal's pulse trains. Each resulting channelized signal processed by the FFT filter bank is then decimated to a sampling rate of Ts 1 to form a channelized segment of the wideband intermediate frequency signal generated from the SDR frontend. In conducting this analysis, the assumption is made for the purposes of simplicity the channel contains at most one pulse train, but in practice, it is possible for pulse trains from more than one tag signal to be present in a single channel. The analysis could still be conducted using the tag i designation while keeping track of the different tag signals in various method implementations. However, in this document, the analysis will be carried on using the simplifying assumption that just one tag signal is present in each channelized signal or sequel so the tag i designation will be dropped and the expression for a single pulse in Equation 32 simplifies as follows:

$$p[n;\delta,\theta] = a_L[n-\delta]e^{i\phi[n-\delta]} \tag{32}$$

where n now indexes the samples in the channelized segment and $\phi[\bullet]$ is the downconverted and decimated phase trajectory of the pulse.

Equation 33 now defines a vector that represents the segment containing the pulse train:

$$x = r + n \tag{33}$$

where the vector r is defined by Equation 34 with all variables appropriately redefined in accordance with the downconversion and decimation that has taken place:

$$r = [\Sigma_{k=1}^{K+1} p[n;\delta + \Sigma_{j=1}^{k} \gamma_j, \theta_k]]_{n_l}^{n_l + n_S - 1} \tag{34}$$

In the channelized segment or sequel the SNR is defined on a per-sample basis during a pulse. Using $\theta^2$ as a per-sample variance of white Gaussian noise and letting the magnitude a[n] from Equation 27 have an average value of A, Equation 35 defines the SNR:

$$SNR = \frac{A^2}{\sigma^2} \tag{35}$$

Following pre-processing to form a spectrogram of each channelized segment, the segment(s) are now ready for processing using coherent single-pulse correlation. The use of single-pulse correlation is used to handle the challenge that the locations of the pulses in the time-frequency domain are a priori only partially known. Also, in the use case of wildlife tracking tags, because of the variability in the low-cost components, manufacturing processes involved in a wildlife tracking tag, and temperature sensitivity of the crystal oscillator included in the tag, the frequency of the tag may only be known to a few kHz.

Various method implementations define a matrix X as the spectrogram of the matrix x where each column of X is the squared-magnitude discrete Fourier (DFT) of a windowed block of x in the form of a column vector. The overlap of DFT's making up columns of the spectrogram (itself an STFT) is set to ensure that the bulk of the energy of a pulse is located in one column of X. In the case of wildlife tracking tags which operate in the very high frequency (VHF) spectrum, the duration of each quasi-complex exponential pulse is at most tens of milliseconds so the pulse bandwidth is on the order of ≤100 Hz. The spectrogram tiles the energy of the segment in the time-frequency plane. If a pulse is present, its energy is concentrated in a small cluster of cells in one column of the spectrogram X. This cluster of cells together forms an approximate correlation receiver output for the pulse. The method of single-pulse correlation therefore involves forming the spectrogram of x by performing DFTs of windowed blocks of x (the vector corresponding with the channelized segment) to form the columns of spectrogram X.

Following single-pulse correlation with the spectrogram, the method implementations include performing multi-pulse combining. This is done because the signal strength of a received pulse may be quite weak while the noise level of the front end of the SDR may be quite high. The combining of the multiple pulses allows for improving the pre-detection SNR to help the detection process be able to determine whether pulses from the desired pulsed radio signal is present in the spectrogram. If adjacent pulses in the tag signal's pulse train in the channelized segment had strongly correlated initial phase, then phase-coherent combining could be employed, but the pulses in the radio signals detected by the methods disclosed herein have highly uncorrelated initial phases and phase trajectories (like the signals from the wildlife tracking tags disclosed herein). The use of the spectrogram X removes the phase information in the STFT of the channelized segment. Processing of the spectrogram to non-coherently combine pulses can increase the SNR gain, but the previously mentioned uncertainty in the various parameters of the pulse train being searched for can make the combining difficult. However, though a given tag signal's frequency is a priori uncertain, in the short term, the tag signals show good pulse-to-pulse frequency stability in the case of wildlife tracking tags. Because of the pulse-to-pulse frequency stability, the energy of a pulse train is concentrated to within three rows or frequency bins of the spectrogram. In this way, preparing the spectrogram has the ability to automatically help with identifying the frequency of the pulse train.

For radio signals that have signal tags with constant or substantially constant inter-pulse intervals, a sliding correlator based on a hardware or a software tapped delay line could be used to carry out the multi-pulse combining in some system and method implementations. However, for radio signals, like those of wildlife tracking tags where empirical measurements of signal tags shows that the mean of the inter-pulse interval has significant a priori uncertainty on the order of 0.1 seconds. Again, this uncertainty can be caused by component variability, manufacturing tolerances of the RC timing circuit of the tag, changing battery voltage over time, and temperature changes. What has been observed, however, is that once the mean of the inter-pulse interval is determined, the pulse-to-pulse jitter around the mean is small (about 10 milliseconds). In order to handle radio signals that have this a priori inter-pulse uncertainty, the various methods disclosed herein utilize a two-component random model to perform the pulse combining.

The two components of the random model are the mean inter-pulse interval $\overline{\tau_{ip}}$ and the short term variation (jitter) around that mean $\delta_{ip}$. From a Bayesian perspective, an uninformative prior is used to account for the variability effects that affect both of these variables. The overall uncertainty is modeled as a uniform random variable that captures the extreme values of both $\overline{\tau_{ip}}$ and $\delta_{ip}$. This uniform random variable is then quantized to the step size of the spectrogram as the overall uncertainty $\tau_{ipu}$. Each outcome of this random variable corresponds to a set of columns R of the spectrogram X to be summed. Since the time offset or shift of the pulses within each channelized segment is also unknown, the set of columns R includes all values of uncertainty for both mean and jitter and all possible shifts (time offsets).

The set of columns R also suggests an implementation for the method since each member $R_i$ defines a set of columns of X to be combined. We construct a $\{0, 1\}$-valued temporal combining matrix W such that each column corresponds to a member of R. When each value of quantized uncertainty is combined with all possible time shifts, W becomes block-Toeplitz, and the temporal multi-pulse combining can be represented as the matrix product XW.

Since a pulse's energy is not confined to a single frequency bin of its constituent spectrogram window, we use a weighted integration across multiple frequency bins in each time window of X. Since this combining in the frequency domain is analogous to temporal combining, a real-valued block-circulant matrix V that pre-multiplies X is defined. The resulting complete temporal-spectral multi-pulse combining operation in various method implementations is the represented by Equation 36 where Y is a matrix of candidate multi-pulse temporal-spectral patterns:

$$Y = VXW \tag{36}$$

The various system and method implementations disclosed herein include determining whether a pulse train that includes a plurality of radio pulses from a desired radio single is present in the spectrogram X. In various method implementations this involves utilized a generalized likelihood ratio test as follows. Each element $y_{ij} = y_\omega$ of matrix Y is the output of a filter matched to a candidate multi-pulse temporal-spectral pattern. Setting $\Omega$ as the set of all candidate multi-pulse temporal-spectral patterns, a generalized likelihood ratio test is used to select a test statistic z according to Equation 37.

$$z = \max_{\omega \in \Omega} y_\omega \tag{37}$$

This test statistic z is then compared with a threshold to make a decision whether or not a set of pulses is present in the spectrogram. The generalized likelihood ratio test can be interpreted as follows: the test statistic z is the maximum of the collection of output energies from the multi-pulse time-frequency correlations. Thus the time frequency region specified by $$\omega^* = \mathop{\mathrm{argmax}}_{\omega \in \Omega} z_\omega$$

that has the greatest energy is the region occupied by the pulse signal with the greatest probability and is therefore the optimum choice for the decision of signal/no signal.

In various method implementations, z is used to define a hypothesis test. Under hypothesis $H_1$, the radio source (a wildlife tracking tag, etc.) is transmitting the pulse train that includes a plurality of radio pulses. Under hypothesis $H_0$, the radio source is not transmitting (for any of a wide variety of possible reasons) or is so far out of range that the signal power is effectively zero. Using Equation 37, a model of z as the outcome of the random variable Z is constructed. A threshold that depends on the false alarm probability selected by the user is then selected as a scalar $\lambda$ and the false alarm probability is then given by Equation 38:

$$P_F = \int_\lambda^\infty f_{Z|H_0}(z|H_0) dz \tag{38}$$

The distribution of the test statistic under $H_0$ is as follows: under $H_0$ any $Y_\omega$ is correlated with many others which share with it overlapping data in time and frequency, so the joint distribution of the random variables $Y_\omega$ with $\omega \in \Omega$ is very complex. The distribution of Z being the maximum of $|\Omega|$ sums of correlated exponential random variables is analytically intractable. However, simulations can be used to compute the empirical probability density function of Z under $H_0$ as $\hat{f}_{Z|H_0}(z|H_0)$. The associated cumulative distribution function of Z under $H_0$, $\hat{F}_{Z|H_0}(z|H_0) = \int_{-\infty}^{z} \hat{f}_{Z|H_0}(x|H_0) dx$, is used along with $P_F$ to determined the decision threshold using the relationship in Equation 39:

$$P_F = 1 - \hat{F}_{Z|H_0}(\lambda|H_0) \quad (39)$$

Any root-finding method may be used in various method implementations to compute the single zero of the function in Equation 40 to find the threshold $\lambda$.

$$g(z) = 1 - P_F - \hat{F}_{Z|H_0}(z|H_0) \quad (40)$$

In various method implementations, when the hypothesis test indicates confirmation of detection of the pulses in one channelized segment, the next channelized segment can be examined to confirm the detection. This approach works for situations like wildlife tracking where the large investment of human and machine resources in tracking is quite high so that the cost of a false positive is correspondingly high. In these implementations, the second independent test of the second channelized segment yields an overall false alarm probability of $P_F^2$. In various method implementations, it is often appropriate to use the inter-pulse interval and the spectral signature from the previous channelized segment's decision to narrow the decision space to improve system and method detection performance.

Various system and method implementations may employ various methods to enable real-time or substantially real-time computation of the intermediate frequency signal from the SDR to detect the presence of the desired pulsed radio signal. Following detection, localization of the signal can then be carried out using any of the localization methods disclosed in this document. In various method implementations, the n log n computational complexity of FFT can be exploited by the spectrogram X which is itself a magnitude STFT. The additional filtering required to temporal-spectral multi-pulse combining may have many different approaches in various implementations. In this document, two are considered: frequency-domain filtering and utilizing sparsity. In frequency-domain filtering, X is processed with a 2D FFT allowing the multi-pulse combining operation (itself a correlation operation) to be performed by a single matrix multiplication followed by a 2D inverse FFT. When tested using a system implementation, a five times improvement of execution speed on the system implementation was observed compared to a direct computation of Y using Equation 36 on the same system implementation.

Figure 27:
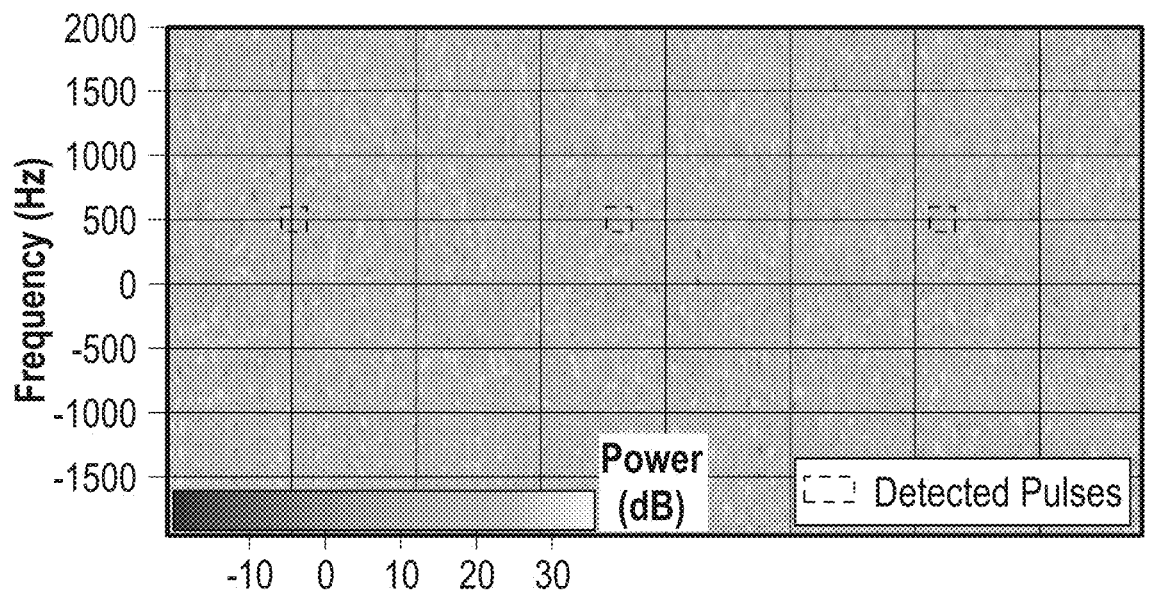
FIG. 27 is a spectrogram (top graph) and time-domain amplitude graph (bottom graph) of the real part of an exemplary radio signal.
Figure 27:
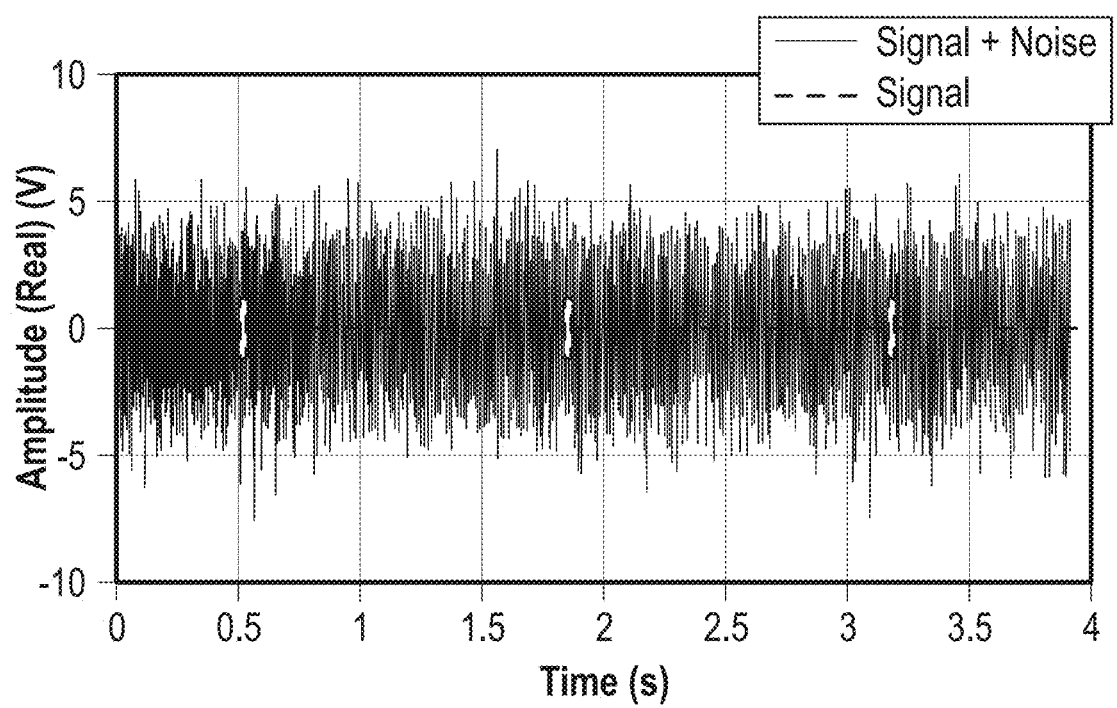

However, the 2D FFT disperses the inherent sparsity of the channelized segment (assuming sparsity in the segment is present already) resulting in sparse computation. In the case of signals emitted by wildlife tracking tags like those disclosed herein, the duration of each pulse is at most tenths of milliseconds, the pulses are separated by about 1 second, and the bandwidth of the pulses found in each channelized segment is a small fraction of the overall bandwidth of the channelized signal supplied by the SDR front end. Accordingly, if a pulse or set of pulses is present in the channelized signal, the pulse(s) energy is concentrated in just a few cells of the spectrogram X as illustrated in the spectrogram diagrams of FIG. 27. FIG. 27 illustrates a case where detection results for SNR=−8 dB involving multi-pulse combining of three pulses. The upper plot is a spectrogram and the lower plot is a time-domain real part of the channelized segment. The detected pulses are illustrated below the noise floor in the time-domain signal and so do not clearly stand out in the spectrogram either. However, the method implementation was able to successfully locate them in time and frequency.

Figure 26:
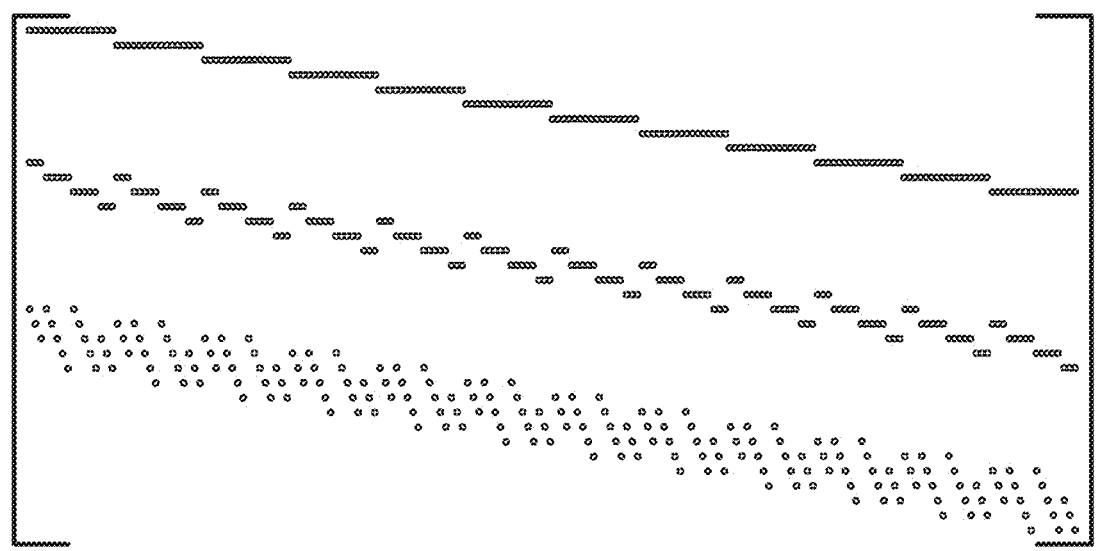
FIG. 26 is a matrix diagram.

The low concentration of energy in the spectrogram implies a significant degree of data sparsity in the temporal and spectral filtering matrices W and V. The matrix diagram of FIG. 26 illustrates the sparsity of the temporal combining matrix W for a quantized set of two inter-pulse interval means and three values for jitter as simulated using the spy.m function from the software package marketed under the tradename MATLAB® by MathWords of Natick, MA. When the use of sparse matrix representations with corresponding computational algorithms were employed using the same system implementation, a ten times computation speed over the direct computation of Y on the same system implementation was observed.

In various method and system implementations, following the detection and confirmation of a pulse train in a channelized segment, the uncertainty in both time and frequency for the desired pulsed radio signal is significantly reduced, which can increase performance and decrease the computation load of detection in subsequent localization of the signal tag. In various method implementations, frequency and time isolation are possible by removing rows and columns from a channelized segment's spectrogram. Various method implementations may work to accomplish this and simplify the spectrogram X by pre- and post-multiplying X with frequency-blinder matrix $F_b$ and time-blinder matrix $T_b$. In various method implementations, the blinder matrices may be applied only once for the confirmed pulse train using the products $V'=VF_b$ and $W'=T_bW$ that results in Equation 41:

$$Y' = V'XW' \quad (41)$$

Simulations were prepared that included synthetically generated pulse trains that contained pulses that closely matched those illustrated in FIG. 25. The initial phase of each phase was randomly generated uniformly on the interval $[0, 2\pi]$. So as to reflect the properties of wildlife tags encountered in wildlife field studies, the mean inter-pulse interval was fixed at 1.3 seconds. However, to realistically assess performance, the method implementation was run for cases of zero ($\tau_{ipu}=0$) and $\tau_{ipu} \in [-0.04, +0.04]$ seconds of prior inter-pulse uncertainty. Jitter was assumed to be zero, as testing of VHF tags demonstrated that the standard deviation of inter-pulse jitter is much less than the duration of the pulse and accordingly a small fraction of one spectrogram window.

Since for a simple VHF transmitter, the ordinary assumption in communications system performance of either or both of frequency acquisition and/or time synchronization based on the use of pilot tones and preambles does not apply. Instead, the system and method implementations need to jointly perform all three of frequency acquisition, time synchronization, and detection. Being able to assess the performance of the method implementations disclosed herein is therefore important particularly for more difficult radio signals composed of the types of complex pulses disclosed herein. Given the possible presence of a pulse train in one of many time-frequency sets the decision problem is of the multiple hypothesis type. The detections of a pulse within a channelized segment is only correct (a True Positive) if the detection was made in a correct frequency bin and for a correct set of time windows. Letting $H_0$ represent the hypothesis that no pulse train is present and $H_\omega$ represent the case where the signal is present in time-frequency set $\omega$. Accepting the wrong time-frequency set ($H_{\tilde{\omega}}$, $\omega \neq \tilde{\omega}$) in the presence of a signal occupying time-frequency set ω is classified as a False Positive as is the accepting $H_\omega$ in the absence of a signal (see Table 1 for the decision table for the pulse detector).

TABLE 1

|  | $H_0$ | $H_{\omega'}$ |
|---|---|---|
| Accept $H_0$ | TN | FN |
| Accept $H_{\hat\omega}$ | FP | TP |
| Accept $H_\omega$ | FP | FP |

Only the False Positive rate under $H_0$ can be specified when establishing the threshold λ as previously discussed so it is important to assess how misdetections (accepting $H_\omega$, ω≠$\hat\omega$, under $H_{\hat\omega}$) affect system performance. The correct detection of K>1 pulses gives more information that is possible with single-pulse (K=1) detection, since the K>1 case yields information on the inter-pulse interval useful in confirmation and localization operations. In this document, performance is assessed by analyzing the performance gain due to multi-pulse combining and the corresponding effect of prior inter-pulse interval uncertainty on performance. The performance results disclosed herein are therefore based on Table 1 as the following empirical probabilities are measured on a per-pulse basis. Setting $P_D$ as the fraction of transmitting pulses for which the decision is a True Positive and $P_F$ is the fraction of pulses for which the detection is a False Positive.

Referring to FIG. 27, the spectrogram (top graph) and time-domain amplitude graph (bottom graph) of the real part of an example radio signal received for which a channelized segment was formed at an SNR of −8 dB. The time-frequency locations of the detected pulses are highlighted by the dotted squares in the spectrogram and in as the white portions in the time-domain graph. The white portions in the time-domain graph indicates the low SNR of the pulses compared to the noise present in the signal.

Figure 32:
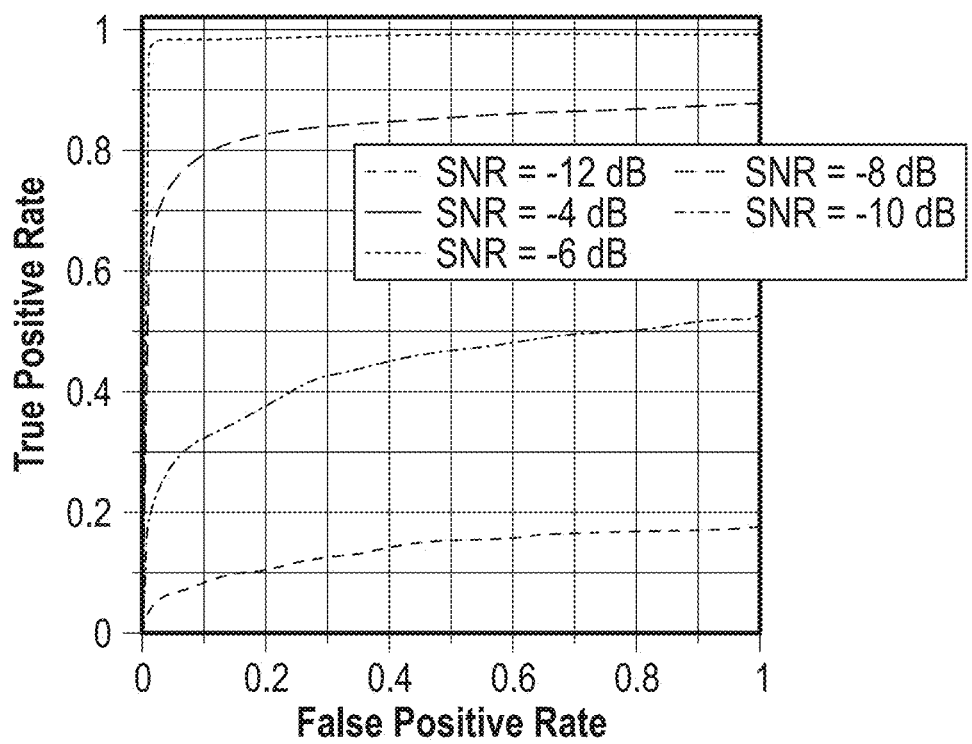
FIG. 32 is a graph of True Positive Rate versus False Positive Rate with zero prior uncertainty and K=3.
Figure 33:
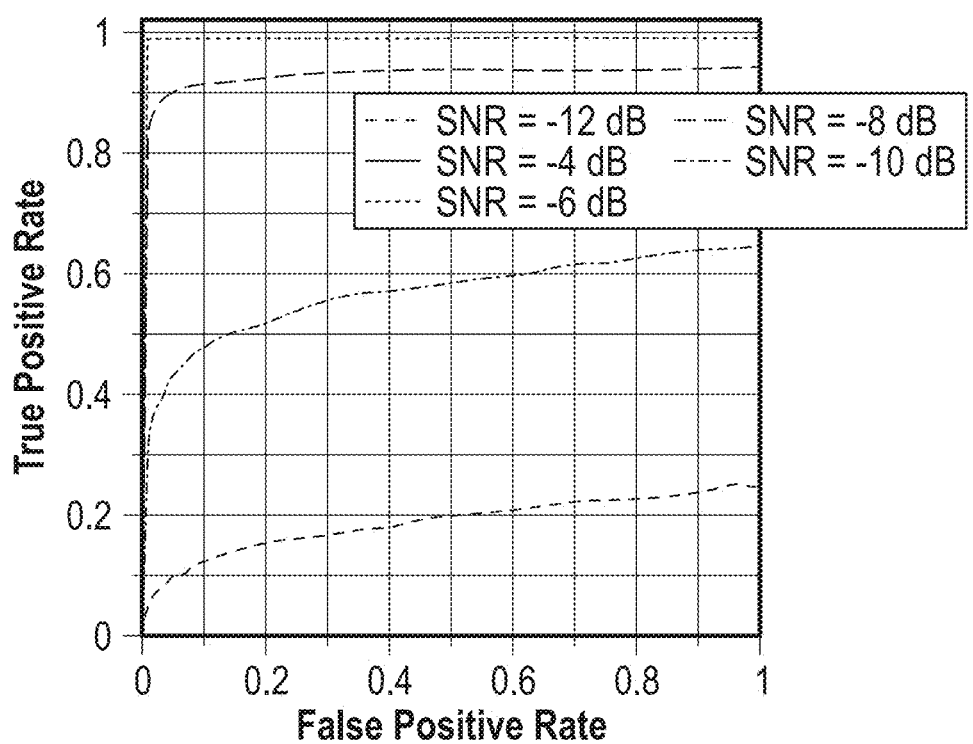
FIG. 33 is a graph of True Positive Rate versus False Positive Rate with non-zero prior uncertainty and K=3.

Referring to FIGS. 28-33, plots of empirical $P_D$ versus $P_F$ at various SNRs are illustrated for K=1 (FIGS. 28-29), K=2 (FIGS. 30-31), and K=3 (FIGS. 32-33). Results for $\tau_{ipu}$=0 and $\tau_{ipu}$∈[−0.04, +0.04] are illustrated in FIGS. 28 and 29, FIGS. 30 and 31, and FIGS. 32 and 33, respectively, in order to highlight the effect of increased prior uncertainty. These figures are related to standard receiver operating characteristics, however given the multiple hypotheses in the detection table, the True Positive rates do not converge to 1 at $P_F$=1 as incorrect (in time and/or frequency) detections can be made in segments containing pulses. For example, for the K=2, $\tau_{ipu}$=0 case at SNR=−10 dB, the true positive rate for $P_F$=1 was 63%. This result implies that 37% of the detections were incorrect in time and/or frequency.

Figure 28:
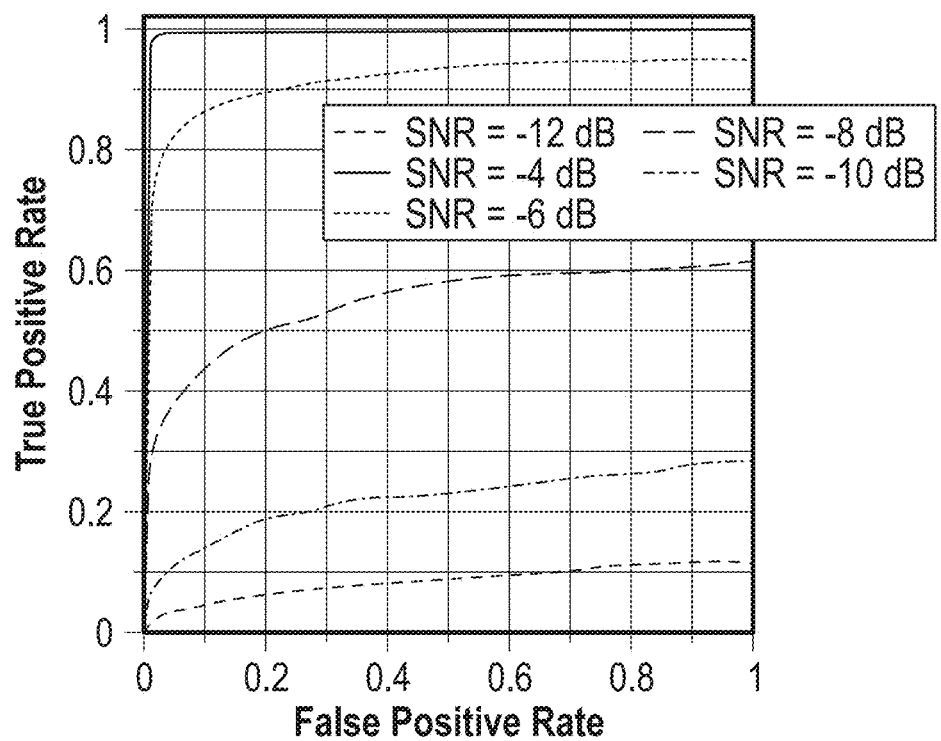
FIG. 28 is a graph of True Positive Rate versus False Positive Rate with zero prior uncertainty and K=1.
Figure 29:
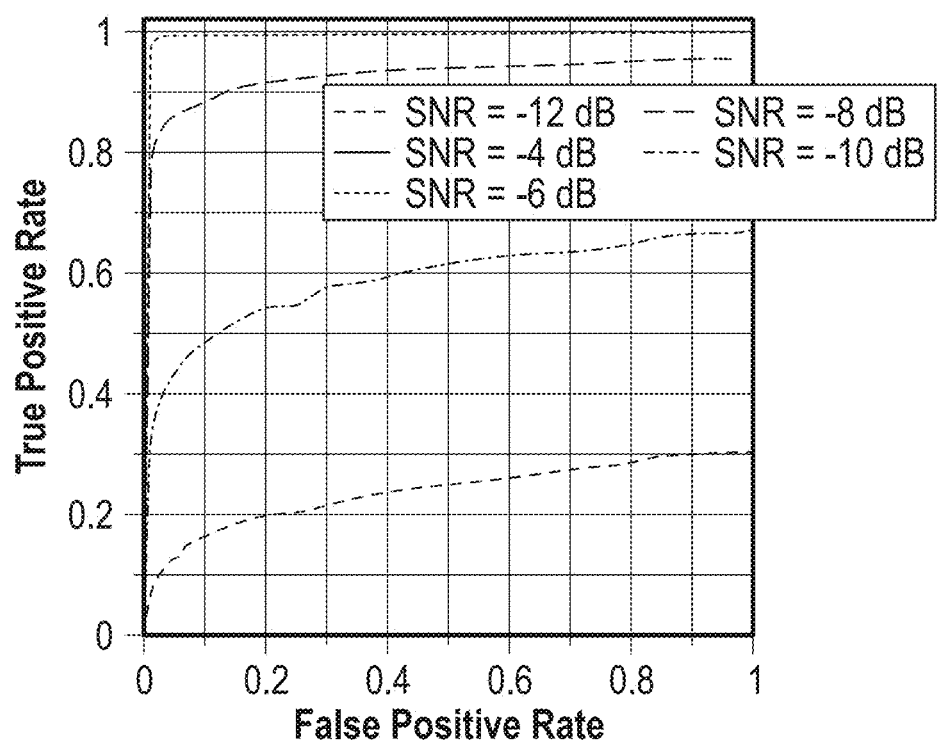
FIG. 29 is a graph of True Positive Rate versus False Positive Rate with non-zero prior uncertainty and K=1.
Figure 30:
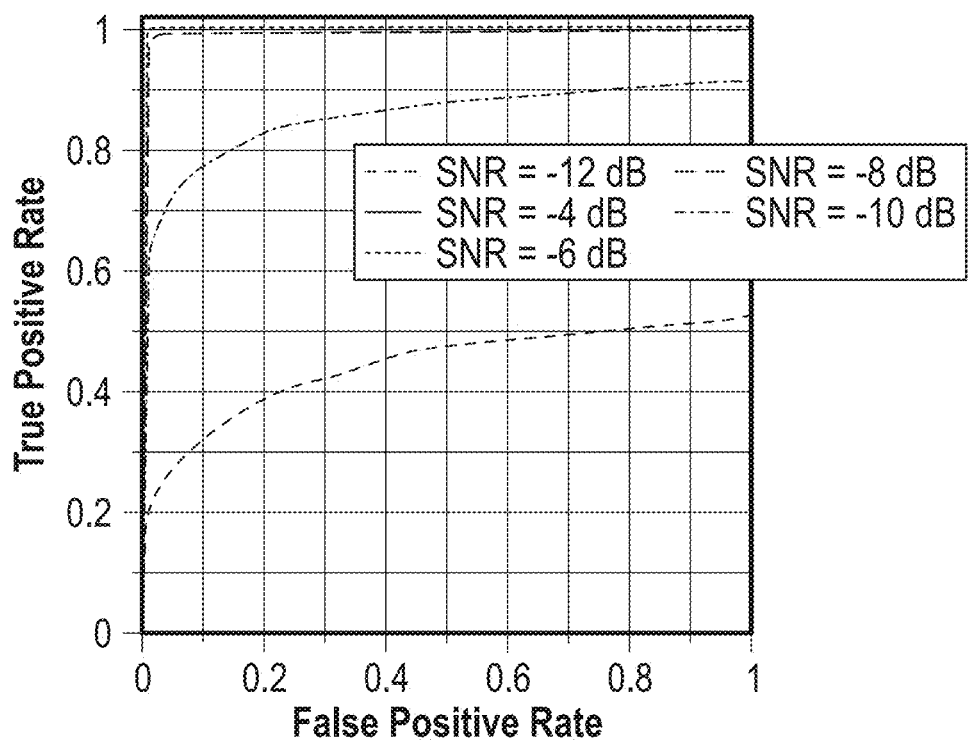
FIG. 30 is a graph of True Positive Rate versus False Positive Rate with zero prior uncertainty and K=2.
Figure 31:
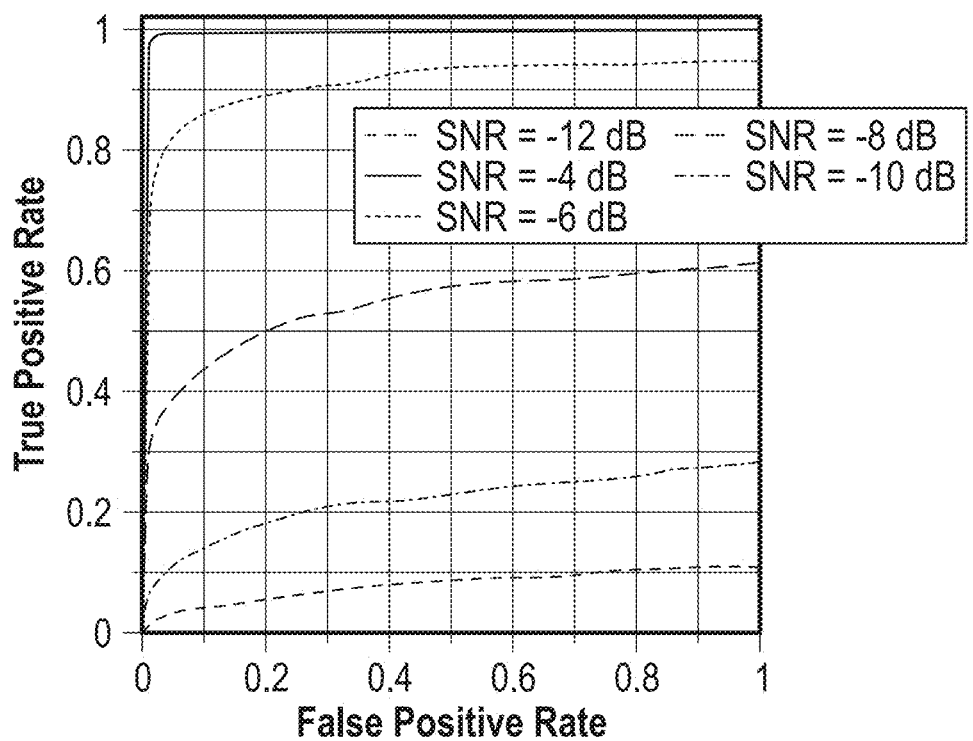
FIG. 31 is a graph of True Positive Rate versus False Positive Rate with non-zero prior uncertainty and K=2.

FIGS. 28, 30, and 32 illustrate how increasing the number of combined pulses increase performance of the system. The performance for K=3 at SNR=−8 dB is similar to that for K=1 at SNR=−4 dB demonstrating the benefit of the method implementations for weak radio signal scenarios like the wildlife tag tracking systems. Given the host dispersal and the rugged terrain where wildlife tags are often deployed, crewed aircraft or UAVs like those disclosed herein are employed where line-of-sight links can be possible with a 20 dB/decade (free space) path loss in SNR. In such a scenario, this 4 dB sensitivity improvement using K=3 represents a detection range improvement of two times and a four times increase in coverage area over the single pulse K=1.

Figure 34:
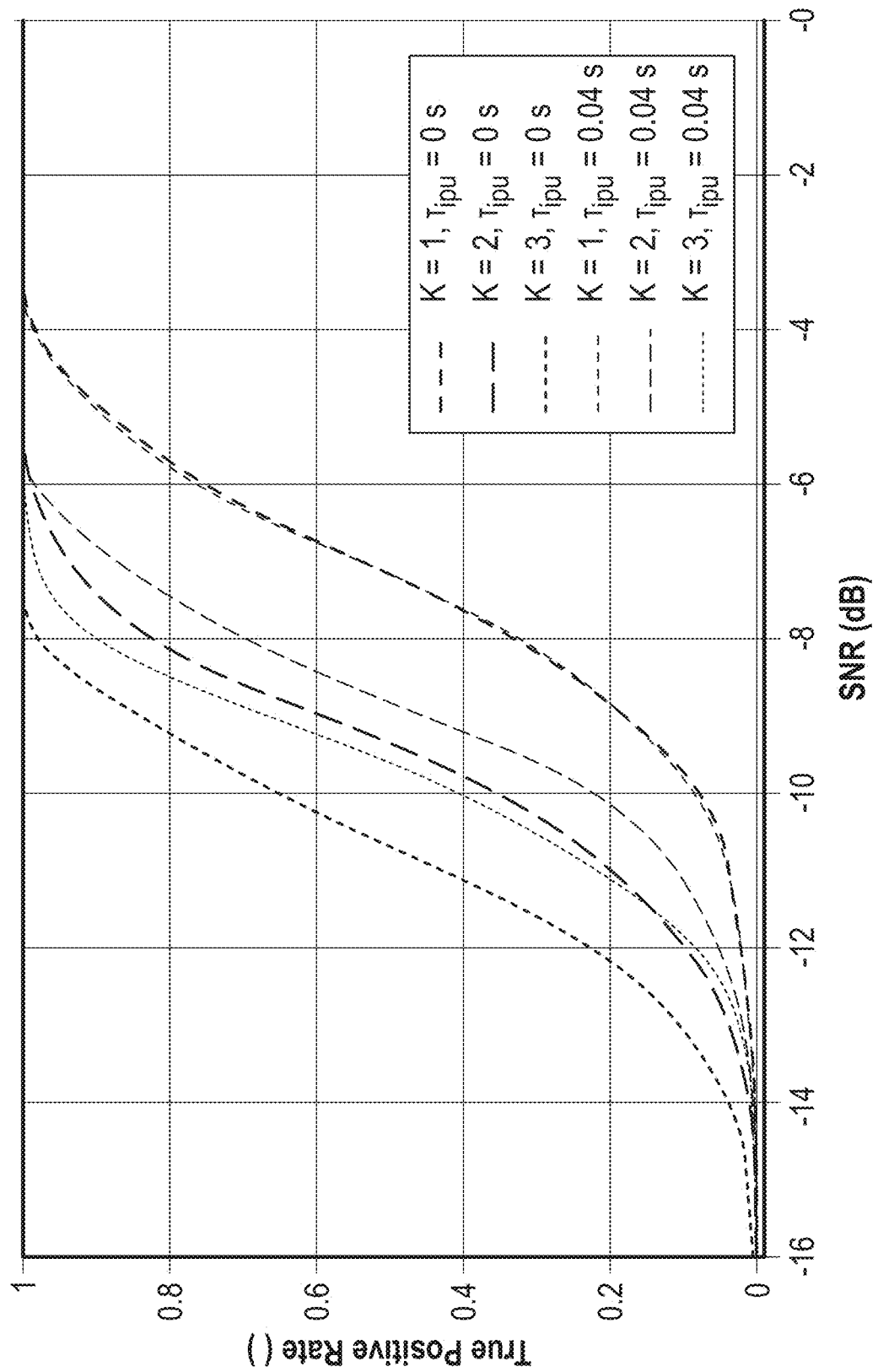
FIG. 34 is a graph of True Positive Rate versus SNR for K=1, 2, 3 and for zero and non-zero prior uncertainty.

The effects of prior uncertainty can be most easily observed by comparing FIGS. 32 and 33. The uncertainty increase the size of the decision space and performance degradation thus is greater as the SNR decreases. The effect of prior uncertainty is more clearly illustrated in FIG. 34, which plots the performance for all three pulse combining cases and for both uncertainty cases on the same graph. Note that because no pulse combining is performed for K=1, the prior uncertainty has no effect on performance for that case.

The method and system implementations disclosed herein, when applied to a wildlife tracking tag radio signal, demonstrating that incoherent combining of three pulses improved detection sensitivity by 4 dB. This sensitivity improvement translated into a four times reduction in search time in the case of free-space path loss such as is found in systems with aircraft-based receivers. The various system and method implementations disclosed herein, beyond the detection sensitivity improvements, can allow for the use of robotic and/or co-robotic systems to reliably detect radio signal notes and transition to localization operations. Those of ordinary skill will readily appreciate how to use the principles disclosed herein to detect pulsed radio signals from a variety of radio sources while experiencing corresponding detection sensitivity improvements.

In places where the description above refers to particular implementations of radio tag detection systems and implementing components, sub-components, methods and sub-methods, it should be readily apparent that a number of modifications may be made without departing from the spirit thereof and that these implementations, implementing components, sub-components, methods and sub-methods may be applied to other radio tag detection systems.

What is claimed is:

1. A method of detecting a plurality of radio pulses, the method comprising:
    using at least one signal processor:
        pre-processing a wideband intermediate frequency signal to form a channelized segment from a software defined radio;
        performing coherent single-pulse correlation using a spectrogram of the channelized segment;
        performing multi-pulse combining with the spectrogram and determining whether a pulse train comprising a plurality of radio pulses from a desired pulsed radio signal is present in the spectrogram; and
        if the pulse train comprising the plurality of radio pulses is present in the spectrogram:
            pre-multiplying the spectrogram using a frequency-blinder matrix and using a time-blinder matrix; and
            post-multiplying the spectrogram using the frequency-blinder matrix and using the time-blinder matrix.

2. The method of claim 1, wherein pre-processing the wideband intermediate frequency signal further comprises channelizing the intermediate frequency signal using a polyphase fast Fourier transform filter bank to form a set of channelized signals.

3. The method of claim 2, further comprising decimating to a desired sampling rate to form the channelized segment.

4. The method of claim 1, wherein performing coherent single-pulse correlation further comprises forming the spectrograph by performing a short-time Fourier transform of a windowed block of the channelized segment.

5. The method of claim 4, wherein columns of the spectrogram are squared-magnitude discrete Fourier transforms of the windowed block.

6. The method of claim 1, wherein performing multi-pulse combining with the spectrogram further comprises:
constructing a temporal combining matrix where each column corresponds with a member of a set of outcomes of a quantized uniform random variable;
generating a real-valued block-circulant matrix; and
performing a matrix product of the spectrogram, the temporal combining matrix, and the real-valued block-circulant matrix to form a matrix of candidate multi-pulse temporal-spectral patterns.

7. The method of claim 6, wherein determining whether the pulse train comprises the plurality of radio pulses from the desired pulsed radio signal further comprises using a sparse matrix representation of each of the temporal combining matrix and of the real-valued block-circulant matrix.

8. The method of claim 1, wherein determining whether the pulse train comprises the plurality of radio pulses from the desired pulsed radio signal further comprises:
using a generalized likelihood ratio test with a maxima of elements of the matrix of candidate multi-pulse temporal spectral patterns and a threshold value to determine whether the pulse train comprises the plurality of radio pulses.

9. The method of claim 8, wherein the threshold value is a scalar value determined by a desired false alarm probability function.

10. The method of claim 1, wherein the desired pulsed radio signal is generated by a wildlife tracking tag.

11. A method of detecting a plurality of radio pulses from a desired radio emitting device, the method comprising:
using at least one signal processor:
pre-processing a pulsed radio signal to form a channelized segment;
performing single-pulse correlation using a spectrogram of the channelized segment;
performing multi-pulse combining with the spectrogram; and
determining whether a pulse train from a desired radio emitting device is present in the spectrogram by using a generalized likelihood ratio test with the maxima of elements of the matrix of candidate multi-pulse temporal spectral patterns and a threshold value.

12. The method of claim 11, wherein pre-processing the pulsed radio signal further comprises channelizing the pulsed radio signal using a polyphase fast Fourier transform filter bank to form a set of channelized signals.

13. The method of claim 12, further comprising decimating to a desired sampling rate to form the channelized segment.

14. The method of claim 11, wherein performing single-pulse correlation further comprises forming the spectrograph by performing a short-time Fourier transform of a windowed block of the channelized segment.

15. The method of claim 14, wherein columns of the spectrogram are squared-magnitude discrete Fourier transforms of the windowed block.

16. The method of claim 11, wherein performing multi-pulse combining with the spectrogram further comprises:
constructing a temporal combining matrix where each column corresponds with a member of a set of outcomes of a quantized uniform random variable;
generating a real-valued block-circulant matrix; and
performing a matrix product of the spectrogram, the temporal combining matrix, and the real-valued block-circulant matrix to form a matrix of candidate multi-pulse temporal-spectral patterns.

17. The method of claim 11, wherein the threshold value is a scalar value determined by a desired false alarm probability function.

18. The method of claim 11, further comprising after determining whether the pulse train from the desired radio emitting device is present in the spectrogram:
pre-multiplying the spectrogram using a frequency-blinder matrix and using a time-blinder matrix; and
post-multiplying the spectrogram using the frequency-blinder matrix and using the time-blinder matrix.

19. A method of detecting a plurality of radio pulses from a desired radio emitting device, the method comprising:
using at least one signal processor:
pre-processing a pulsed radio signal to form a channelized segment;
performing single-pulse correlation using a spectrogram of the channelized segment;
performing multi-pulse combining with the spectrogram by:
constructing a temporal combining matrix where each column corresponds with a member of a set of outcomes of a quantized uniform random variable;
generating a real-valued block-circulant matrix; and
performing a matrix product of the spectrogram, the temporal combining matrix, and the real-valued block-circulant matrix to form a matrix of candidate multi-pulse temporal-spectral patterns; and
determining whether a pulse train from a desired radio emitting device is present in the spectrogram.

20. The method of claim 19, wherein determining whether the pulse train from the desired radio emitting device is present in the spectrogram further comprises using a generalized likelihood ratio test with the maxima of elements of the matrix of candidate multi-pulse temporal spectral patterns and a threshold value.

* * * * *